United States Patent
Hara et al.

(10) Patent No.: US 9,223,224 B2
(45) Date of Patent: Dec. 29, 2015

(54) EXPOSURE APPARATUS WITH COMPONENT FROM WHICH LIQUID IS PROTECTED AND/OR REMOVED AND DEVICE FABRICATING METHOD

(75) Inventors: Hideaki Hara, Kumagaya (JP); Hiroaki Takaiwa, Kumagaya (JP)

(73) Assignee: NIKON CORPORATION, Tokyo (JP)

( * ) Notice: Subject to any disclaimer, the term of this patent is extended or adjusted under 35 U.S.C. 154(b) by 498 days.

(21) Appl. No.: 11/360,807

(22) Filed: Feb. 24, 2006

(65) Prior Publication Data
US 2006/0139594 A1 Jun. 29, 2006

Related U.S. Application Data

(63) Continuation of application No. PCT/JP2004/012795, filed on Aug. 27, 2004.

(30) Foreign Application Priority Data

Aug. 29, 2003 (JP) .................................. 2003-307025

(51) Int. Cl.
G03B 27/52 (2006.01)
G03F 7/20 (2006.01)

(52) U.S. Cl.
CPC ........ G03F 7/70341 (2013.01); G03F 7/70916 (2013.01)

(58) Field of Classification Search
CPC .................................................. G03F 7/70916
USPC ................................ 355/30, 72, 53; 359/665
See application file for complete search history.

(56) References Cited

U.S. PATENT DOCUMENTS

| 4,346,164 A | 8/1982 | Tabarelli et al. |
| 4,480,910 A | 11/1984 | Takanashi et al. |
| 4,780,747 A * | 10/1988 | Suzuki et al. ................ 355/68 |
| 5,493,403 A | 2/1996 | Nishi |
| 5,528,118 A | 6/1996 | Lee |
| 5,610,683 A | 3/1997 | Takahashi |
| 5,623,853 A | 4/1997 | Novak et al. |
| 5,646,413 A | 7/1997 | Nishi |
| 5,715,039 A | 2/1998 | Fukuda et al. |
| 5,825,043 A | 10/1998 | Suwa |
| 5,874,820 A | 2/1999 | Lee |
| 5,969,441 A | 10/1999 | Loopstra et al. |
| 6,020,964 A | 2/2000 | Loopstra et al. |

(Continued)

FOREIGN PATENT DOCUMENTS

DE 221 563 A1 4/1985
DE 224 448 A1 7/1985

(Continued)

OTHER PUBLICATIONS

Lin, B.J. "Semiconductor Foundry, Lithography, and Partners." Proceedings of SPIE, vol. 4688, pp. 11-24, 2002.
Switkes, M., et al. "Resolution Enhancement of 157nm Lithography by Liquid Immersion." Proceedings of SPIE, vol. 4691, pp. 459-465, 2002.
Switkes, M., et al. "Resolution Enhancement of 157nm Lithography by Liquid Immersion." J. Microlith., Microfab., Microsyst., vol. 1, No. 3, pp. 1-4, 2002.
Owa, Soichi, et al. "Nikon F2 Exposure Tool," slides 1-25, 3rd 157nm Symposium, Sep. 4, 2002.
Owa, Soichi. "Immersion Lithography," slides 1-24, Immersion Lithography Workshop, Dec. 11, 2002.

(Continued)

*Primary Examiner* — Chia-How Michael Liu

(57) ABSTRACT

An exposure apparatus exposes a substrate by filling a liquid between a projection optical system and the substrate, and projecting the image of a pattern onto the substrate through the projection optical system and the liquid, and includes a liquid removing mechanism that intermittently blows a gas against a reference member, movable mirror, and the like, to which the liquid is adhered in order to remove that liquid.

43 Claims, 17 Drawing Sheets

(56) References Cited

U.S. PATENT DOCUMENTS

| | | | |
|---|---|---|---|
| 6,327,025 B1 | 12/2001 | Imai | |
| 6,341,007 B1 | 1/2002 | Nishi et al. | |
| 6,486,955 B1 | 11/2002 | Nishi | |
| 6,496,257 B1 | 12/2002 | Taniguchi et al. | |
| 6,565,419 B1 | 5/2003 | Nishio et al. | |
| 6,788,477 B2* | 9/2004 | Lin | 359/820 |
| 6,801,301 B2* | 10/2004 | Miyajima et al. | 355/72 |
| 6,988,327 B2* | 1/2006 | Garcia et al. | 34/407 |
| 2002/0103657 A1* | 8/2002 | Sun et al. | 705/1 |
| 2002/0163629 A1 | 11/2002 | Switkes et al. | |
| 2003/0030916 A1 | 2/2003 | Suenaga | |
| 2003/0053074 A1 | 3/2003 | Hill | |
| 2003/0174408 A1 | 9/2003 | Rostalski et al. | |
| 2004/0000627 A1 | 1/2004 | Schuster | |
| 2004/0075895 A1 | 4/2004 | Lin | |
| 2004/0109237 A1 | 6/2004 | Epple et al. | |
| 2004/0114117 A1 | 6/2004 | Bleeker | |
| 2004/0118184 A1 | 6/2004 | Violette | |
| 2004/0119954 A1 | 6/2004 | Kawashima et al. | |
| 2004/0125351 A1 | 7/2004 | Krautschik | |
| 2004/0136494 A1 | 7/2004 | Lof et al. | |
| 2004/0160582 A1 | 8/2004 | Lof et al. | |
| 2004/0165159 A1 | 8/2004 | Lof et al. | |
| 2004/0169834 A1 | 9/2004 | Richter et al. | |
| 2004/0169924 A1 | 9/2004 | Flagello et al. | |
| 2004/0180294 A1 | 9/2004 | Baba-Ali et al. | |
| 2004/0180299 A1 | 9/2004 | Rolland et al. | |
| 2004/0207824 A1 | 10/2004 | Lof et al. | |
| 2004/0211920 A1 | 10/2004 | Maria Derksen et al. | |
| 2004/0224265 A1 | 11/2004 | Endo et al. | |
| 2004/0224525 A1 | 11/2004 | Endo et al. | |
| 2004/0227923 A1 | 11/2004 | Flagello et al. | |
| 2004/0233405 A1 | 11/2004 | Kato et al. | |
| 2004/0253547 A1 | 12/2004 | Endo et al. | |
| 2004/0253548 A1 | 12/2004 | Endo et al. | |
| 2004/0257544 A1 | 12/2004 | Vogel et al. | |
| 2004/0259008 A1 | 12/2004 | Endo et al. | |
| 2004/0259040 A1 | 12/2004 | Endo et al. | |
| 2004/0263808 A1 | 12/2004 | Sewell | |
| 2004/0263809 A1 | 12/2004 | Nakano | |
| 2005/0002004 A1 | 1/2005 | Kolesnychenko et al. | |
| 2005/0007569 A1 | 1/2005 | Streefkerk et al. | |
| 2005/0007570 A1 | 1/2005 | Streefkerk et al. | |
| 2005/0018155 A1 | 1/2005 | Cox et al. | |
| 2005/0018156 A1 | 1/2005 | Mulkens et al. | |
| 2005/0024609 A1 | 2/2005 | De Smit et al. | |
| 2005/0030497 A1 | 2/2005 | Nakamura | |
| 2005/0030498 A1 | 2/2005 | Mulkens | |
| 2005/0030506 A1 | 2/2005 | Schuster | |
| 2005/0030511 A1 | 2/2005 | Auer-Jongepier et al. | |
| 2005/0036121 A1 | 2/2005 | Hoogendam et al. | |
| 2005/0036183 A1 | 2/2005 | Yeo et al. | |
| 2005/0036184 A1 | 2/2005 | Yeo et al. | |
| 2005/0036213 A1 | 2/2005 | Mann et al. | |
| 2005/0037269 A1 | 2/2005 | Levinson | |
| 2005/0041225 A1 | 2/2005 | Sengers et al. | |
| 2005/0042554 A1 | 2/2005 | Dierichs et al. | |
| 2005/0046813 A1 | 3/2005 | Streefkerk et al. | |
| 2005/0046934 A1 | 3/2005 | Ho et al. | |
| 2005/0048220 A1 | 3/2005 | Mertens et al. | |
| 2005/0048223 A1 | 3/2005 | Pawloski et al. | |
| 2005/0068639 A1 | 3/2005 | Pierrat et al. | |
| 2005/0073670 A1 | 4/2005 | Carroll | |
| 2005/0078286 A1 | 4/2005 | Dierichs et al. | |
| 2005/0078287 A1 | 4/2005 | Sengers et al. | |
| 2005/0084794 A1 | 4/2005 | Meagley et al. | |
| 2005/0094116 A1 | 5/2005 | Flagello et al. | |
| 2005/0100745 A1 | 5/2005 | Lin et al. | |
| 2005/0110973 A1 | 5/2005 | Streefkerk et al. | |
| 2005/0117224 A1 | 6/2005 | Shafer et al. | |
| 2005/0122497 A1 | 6/2005 | Lyons et al. | |
| 2005/0132914 A1 | 6/2005 | Mulkens et al. | |
| 2005/0134815 A1 | 6/2005 | Van Santen et al. | |
| 2005/0134817 A1 | 6/2005 | Nakamura | |
| 2005/0141098 A1 | 6/2005 | Schuster | |
| 2005/0145265 A1 | 7/2005 | Ravkin et al. | |
| 2005/0145803 A1 | 7/2005 | Hakey et al. | |
| 2005/0146694 A1 | 7/2005 | Tokita | |
| 2005/0146695 A1 | 7/2005 | Kawakami | |
| 2005/0147920 A1 | 7/2005 | Lin et al. | |
| 2005/0153424 A1 | 7/2005 | Coon | |
| 2005/0158673 A1 | 7/2005 | Hakey et al. | |
| 2005/0164502 A1 | 7/2005 | Deng et al. | |
| 2005/0174549 A1 | 8/2005 | Duineveld et al. | |
| 2005/0175940 A1 | 8/2005 | Dierichs | |
| 2005/0185269 A1 | 8/2005 | Epple et al. | |
| 2005/0190435 A1 | 9/2005 | Shafer et al. | |
| 2005/0190455 A1 | 9/2005 | Rostalski et al. | |
| 2005/0205108 A1 | 9/2005 | Chang et al. | |
| 2005/0213061 A1 | 9/2005 | Hakey et al. | |
| 2005/0213072 A1 | 9/2005 | Schenker et al. | |
| 2005/0217135 A1 | 10/2005 | O'Donnell et al. | |
| 2005/0217137 A1 | 10/2005 | Smith et al. | |
| 2005/0217703 A1 | 10/2005 | O'Donnell | |
| 2005/0219481 A1 | 10/2005 | Cox et al. | |
| 2005/0219482 A1 | 10/2005 | Baselmans et al. | |
| 2005/0219499 A1 | 10/2005 | Maria Zaal et al. | |
| 2005/0225735 A1 | 10/2005 | Magome et al. | |
| 2005/0225737 A1 | 10/2005 | Weissenrieder et al. | |
| 2005/0231694 A1 | 10/2005 | Kolesnychenko et al. | |
| 2005/0237501 A1 | 10/2005 | Furukawa et al. | |
| 2005/0243292 A1 | 11/2005 | Baselmans et al. | |
| 2005/0245005 A1 | 11/2005 | Benson | |
| 2005/0253090 A1 | 11/2005 | Gau et al. | |
| 2005/0259232 A1 | 11/2005 | Streefkerk et al. | |
| 2005/0259233 A1 | 11/2005 | Streefkerk et al. | |
| 2005/0264778 A1 | 12/2005 | Lof et al. | |
| 2005/0270505 A1 | 12/2005 | Smith | |
| 2006/0077367 A1 | 4/2006 | Kobayashi et al. | |
| 2006/0154183 A1 | 7/2006 | Magome | |
| 2007/0064210 A1 | 3/2007 | Kobayashi et al. | |

FOREIGN PATENT DOCUMENTS

| | | |
|---|---|---|
| EP | 0 605 103 A1 | 7/1994 |
| EP | 1 420 298 A2 | 5/2004 |
| EP | 1 420 299 A2 | 5/2004 |
| EP | 1 486 828 A2 | 12/2004 |
| EP | 1 491 956 A1 | 12/2004 |
| EP | 1 571 694 A1 | 9/2005 |
| EP | 1 571 695 A1 | 9/2005 |
| EP | 1 624 481 A1 | 2/2006 |
| EP | 1 628 329 A1 | 2/2006 |
| EP | 1 641 028 A1 | 3/2006 |
| EP | 1 653 501 A1 | 5/2006 |
| JP | A 57-153433 | 9/1982 |
| JP | A 58-202448 | 11/1983 |
| JP | A 59-019912 | 2/1984 |
| JP | A 62-065326 | 3/1987 |
| JP | A 63-157419 | 6/1988 |
| JP | A 04-065603 | 3/1992 |
| JP | A 04-305915 | 10/1992 |
| JP | A 04-305917 | 10/1992 |
| JP | A 05-062877 | 3/1993 |
| JP | A 06-124873 | 5/1994 |
| JP | A-06-168866 | 6/1994 |
| JP | A-H6-168866 | 6/1994 |
| JP | A 07-176468 | 7/1995 |
| JP | A 07-220990 | 8/1995 |
| JP | A 08-037149 | 2/1996 |
| JP | A 08-166475 | 6/1996 |
| JP | A-8-233964 | 9/1996 |
| JP | A 08-316125 | 11/1996 |
| JP | A 08-330224 | 12/1996 |
| JP | A 10-163099 | 6/1998 |
| JP | A 10-214783 | 8/1998 |
| JP | A 10-255319 | 9/1998 |
| JP | A 10-303114 | 11/1998 |
| JP | A 10-340846 | 12/1998 |
| JP | A 11-176727 | 7/1999 |
| JP | A 2000-058436 | 2/2000 |
| JP | A-2000-114141 | 4/2000 |
| JP | A 2000-505958 | 5/2000 |
| JP | A-2000-228439 | 8/2000 |

(56) References Cited

FOREIGN PATENT DOCUMENTS

| | | |
|---|---|---|
| JP | A-2001-510577 | 7/2001 |
| JP | WO 2004/019128 A2 | 3/2004 |
| JP | A-2004-289128 | 10/2004 |
| JP | A-2005-019864 | 1/2005 |
| JP | A-2005-072404 | 3/2005 |
| TW | 21041 | 9/1976 |
| WO | WO 99/28790 A1 | 6/1999 |
| WO | WO 99/49504 | 9/1999 |
| WO | WO 00/22376 A1 | 4/2000 |
| WO | WO 02/091078 A1 | 11/2002 |
| WO | WO 03/077037 A1 | 9/2003 |
| WO | WO 2004/055803 A1 | 7/2004 |
| WO | WO 2004/057589 A1 | 7/2004 |
| WO | WO 2004/057590 A1 | 7/2004 |
| WO | WO 2004/077154 A2 | 9/2004 |
| WO | WO 2004/081666 A1 | 9/2004 |
| WO | WO 2004/090577 A2 | 10/2004 |
| WO | WO 2004/090633 A2 | 10/2004 |
| WO | WO 2004/090634 A2 | 10/2004 |
| WO | WO 2004/092830 A2 | 10/2004 |
| WO | WO 2004/092833 A2 | 10/2004 |
| WO | WO 2004/093130 A2 | 10/2004 |
| WO | WO 2004/093159 A2 | 10/2004 |
| WO | WO 2004/093160 A2 | 10/2004 |
| WO | WO 2004/095135 A2 | 11/2004 |
| WO | WO 2005/001432 A2 | 1/2005 |
| WO | WO 2005/001572 A2 | 1/2005 |
| WO | WO 2005/003864 A2 | 1/2005 |
| WO | WO 2005/006026 A2 | 1/2005 |
| WO | WO 2005/008339 A2 | 1/2005 |
| WO | WO 2005/013008 A2 | 2/2005 |
| WO | WO 2005/015283 A1 | 2/2005 |
| WO | WO 2005/017625 A2 | 2/2005 |
| WO | WO 2005/019935 A2 | 3/2005 |
| WO | WO 2005/022266 A2 | 3/2005 |
| WO | WO 2005/024325 A2 | 3/2005 |
| WO | WO 2005/024517 A2 | 3/2005 |
| WO | WO 2005/034174 A2 | 4/2005 |
| WO | WO 2005/050324 A2 | 6/2005 |
| WO | WO 2005/054953 A2 | 6/2005 |
| WO | WO 2005/054955 A2 | 6/2005 |
| WO | WO 2005/059617 A2 | 6/2005 |
| WO | WO 2005/059618 A2 | 6/2005 |
| WO | WO 2005/059645 A2 | 6/2005 |
| WO | WO 2005/059654 A1 | 6/2005 |
| WO | WO 2005/062128 A2 | 7/2005 |
| WO | WO 2005/064400 A2 | 7/2005 |
| WO | WO 2005/064405 A2 | 7/2005 |
| WO | WO 2005/069055 A2 | 7/2005 |
| WO | WO 2005/069078 A1 | 7/2005 |
| WO | WO 2005/069081 A2 | 7/2005 |
| WO | WO 2005/071491 A2 | 8/2005 |
| WO | WO 2005/074606 A2 | 8/2005 |
| WO | WO 2005/076084 A1 | 8/2005 |
| WO | WO 2005/081030 A1 | 9/2005 |
| WO | WO 2005/081067 A1 | 9/2005 |
| WO | WO 2005/098504 A1 | 10/2005 |
| WO | WO 2005/098505 A1 | 10/2005 |
| WO | WO 2005/098506 A1 | 10/2005 |
| WO | WO 2005/106589 A1 | 11/2005 |
| WO | WO 2005/111689 A2 | 11/2005 |
| WO | WO 2005/111722 A2 | 11/2005 |
| WO | WO 2005/119368 A2 | 12/2005 |
| WO | WO 2005/119369 A1 | 12/2005 |

OTHER PUBLICATIONS

Owa, Soichi, et al. "Immersion Lithography; its Potential Performance and Issues." Proceedings of SPIE, vol. 5040, pp. 724-733, 2003.

Owa, Soichi, et al. "Potential Performance and Feasibility of Immersion Lithography," slides 1-33, NGL Workshop 2003, Jul. 2003.

Owa, Soichi, et al. "Update on 193nm Immersion Exposure Tool," slides 1-38, Immersion Workshop 2004, Jan. 27, 2004.

Owa, Soichi, et al. "Update on 193nm Immersion Exposure Tool," slides 1-51, Litho Forum, Jan. 28, 2004.

Jun. 24, 2008 European Search Report issued in European Application No. 04772744.1.

Nov. 12, 2008 Office Action issued in European Application No. 04772744.1.

Dec. 14, 2010 Office Action issued in European Application No. 04772744.1.

Feb. 7, 2007 Office Action issued in Singapore Application No. 200602388-1.

Jun. 20, 2007 Supplemental Search Report issued in Singapore Application No. 200602388-1.

Dec. 3, 2007 Notice of Allowance issued in Singapore Application No. 200602388-1.

Aug. 10, 2007 Office Action issued in Chinese Application No. 200480024379.4 with English translation.

Aug. 21, 2009 Office Action issued in Chinese Application No. 200810109437.3 with English translation.

Sep. 30, 2010 Office Action issued in Singapore Application No. 200806393-5.

Dec. 14, 2004 International Search Report issued in International Application No. PCT/JP2004/012795 with English translation.

Dec. 14, 2004 Written Opinion issued in International Application No. PCT/JP2004/012795 with English translation.

Jan. 20, 2009 Office Action issued in Japanese Application No. 2005-513551 with English translation.

Office Action (Notice of Allowance) dated Apr. 12, 2011 in Singapore Patent Application 200806393-5.

Korean Patent Office, Notice of Grounds for Rejection mailed Mar. 29, 2012 in Korean Patent Application No. 10-2006-7000695 w/English-language Translation.

Jan. 4, 2012 Office Action in Korean Patent Application No. 2011-7021423 (with English translation).

Jan. 4, 2012 Office Action in Japanese Patent Application No. 2009-068654 (with English translation).

Office Action issued in corresponding Taiwan Application No. 093126127 on Jul. 19, 2011. (with English Language Translation).

May 17, 2013 Summons to Attend Oral Proceedings issued in European Patent Application No. 04 772 744.1.

Oct. 22, 2013 Office Action issued in European Patent Application No. 04772744.1.

Oct. 29, 2013 Office Action issued in Japanese Patent Application No. 2012-047215 (with English Translation).

Oct. 22, 2014 Extended European Search Report issued in European Application No. 14163834.6.

Oct. 10, 2014 Search and Examination Report issued in Singaporean Application No. 2012022182.

* cited by examiner

FIG. 18
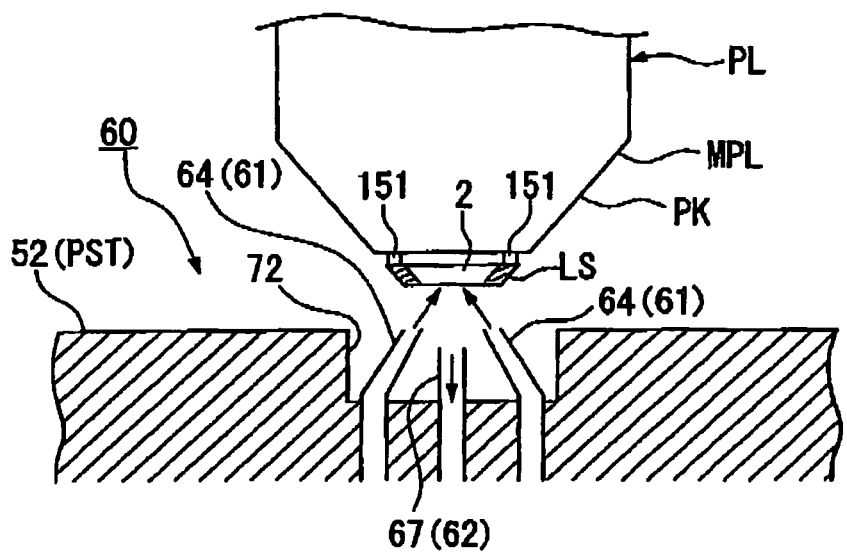
FIG. 19
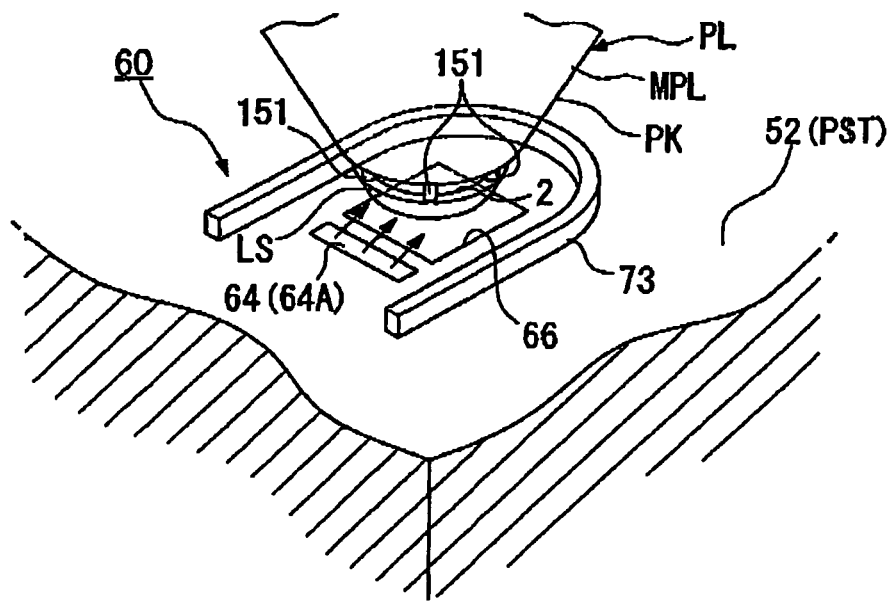
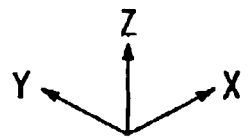

EXPOSURE APPARATUS WITH COMPONENT FROM WHICH LIQUID IS PROTECTED AND/OR REMOVED AND DEVICE FABRICATING METHOD

CROSS-REFERENCE TO RELATED APPLICATION

This is a Continuation Application of International Application No. PCT/JP2004/012795, filed Aug. 27, 2004, which claims priority to Japanese Patent Application No. 2003-307025 (filed Aug. 29, 2003). The contents of the aforementioned application are incorporated herein by reference.

BACKGROUND OF THE INVENTION

1. Field of the Invention

The present invention relates to an exposure apparatus, which exposes a pattern on a substrate through a projection optical system and a liquid, and a device fabricating method.

2. Description of Related Art

Semiconductor devices and liquid crystal display devices are fabricated by a so-called photolithography technique, wherein a pattern formed on a mask is transferred onto a photosensitive substrate. An exposure apparatus used by this photolithographic process includes a mask stage that supports the mask, and a substrate stage that supports the substrate, and transfers the pattern of the mask onto the substrate via a projection optical system while successively moving the mask stage and the substrate stage. There has been demand in recent years for higher resolution projection optical system in order to handle the much higher levels of integration of device patterns. The shorter the exposure wavelength used and the larger the numerical aperture of the projection optical system, the higher the resolution of the projection optical system. Consequently, the exposure wavelength used in exposure apparatus has shortened year by year, and the numerical aperture of projection optical systems has also increased. Furthermore, the mainstream exposure wavelength currently is 248 nm KrF excimer laser, but an even shorter wavelength 193 nm ArF excimer is also being commercialized. In addition, as well as resolution, the depth of focus (DOF) is also important when performing an exposure. The following equations respectively express the resolution R and the depth of focus δ.

$$R = k_1 \cdot \lambda / NA, \quad (1)$$

$$\delta = \pm k_2 \cdot \lambda / NA^2, \quad (2)$$

Therein, λ is the exposure wavelength, NA is the numerical aperture of the projection optical system, and $k_1$ and $k_2$ are the process coefficient. Equations (1) and (2) teach that if the exposure wavelength λ is shortened and the numerical aperture NA is increased in order to enhance the resolution R, then the depth of focus δ narrows.

If the depth of focus δ becomes excessively narrow, then it will become difficult to align the surface of the substrate with the image plane of the projection optical system, and there will be a risk of insufficient margin of focus during the exposure operation. Accordingly, a liquid immersion method has been proposed, as disclosed in, for example, PCT International Publication WO99/49504 below, as a method to substantially shorten the exposure wavelength and increase the depth of focus. This liquid immersion method fills a liquid, such as water or an organic solvent, between the lower surface of the projection optical system and the surface of the substrate, thus taking advantage of the fact that the wavelength of the exposure light in a liquid is 1/n that of in air (where n is the refractive index of the liquid, normally about 1.2 to 1.6), thereby improving the resolution as well as increasing the depth of focus by approximately n times. The contents of the abovementioned international publication is hereby incorporated by reference in its entirety to the extent permitted by the national laws and regulations of the designated status (or elected states) designated by the present international patent application.

Incidentally, the abovementioned related art has the problems discussed below.

The exposure apparatus disclosed in the abovementioned PCT International Publication No. WO99/49504 has a constitution wherein the liquid is supplied and recovered so that an immersion area is formed on one part of the substrate; however, if, in a state after the immersion exposure is completed and the liquid in the immersion areas is not sufficiently recovered, the substrate stage, for example, is moved to a load/unload position (substrate exchange position) in order to unload the substrate on the substrate stage and load a new substrate, then there is a possibility that the liquid remaining (adhered) on the front of the projection optical system, or in the liquid supply nozzle, the recovery nozzle, or the like, may drop onto peripheral devices, for example, the guide surface of the stage, the reflecting mirror for the stage interferometer, and the like.

In addition, if liquid remains on the optical element at the front of the projection optical system, then there is a possibility that adhered residue (a so-called water mark) will be left on the optical element at the front of the projection optical system after this remaining liquid has vaporized, and will adversely affect the pattern formed on the substrate when performing the next exposure process. In addition, it is conceivable that immersion areas will form, even when not performing the exposure process, when using a reference plane member, a fiducial mark member, and the like, disposed around the substrate on the substrate stage, and there is a possibility that the liquid in these immersion areas will not be sufficiently recovered and that adhered residue will be left on these members, or that the liquid remaining on these members will scatter.

Furthermore, it is also conceivable that the liquid from the immersion area on the substrate during exposure will scatter and adhere to peripheral apparatuses, members, and the like. If the liquid scattered from the substrate during exposure adheres to, for example, the reflecting mirror for each of the stage interferometers, then there is a risk that it will degrade the accuracy of the stage position measured by the interferometer.

SUMMARY OF THE INVENTION

The present invention was made considering such circumstances, and it is an object of the present invention to provide an exposure apparatus that can sufficiently remove and/or recover unnecessary liquid and form a desired device pattern on the substrate when projecting and exposing a pattern onto a substrate through a projection optical system and liquid, and a device fabricating method that uses this exposure apparatus.

To solve the abovementioned problems, the present invention adopts the following constitution corresponding to FIGS. 1 to 22, which describe the embodiments. Furthermore, to facilitate understanding, the present invention will be explained using the corresponding symbols in drawings that describe one embodiment, but the present invention is not limited to this embodiment.

The exposure apparatus of the present invention is an exposure apparatus that exposes a substrate by filling a liquid between a projection optical system and the substrate, and projecting the image of a pattern onto the substrate through the projection optical system and the liquid, including a liquid removing mechanism that intermittently blows a gas against a component to which the liquid is adhered in order to remove that liquid, the component disposed in a vicinity of the image plane of the projection optical system.

In addition, the exposure apparatus of the present invention is an exposure apparatus that exposes a substrate by filling a liquid between a projection optical system and the substrate, and projecting the image of a pattern onto the substrate through the projection optical system and the liquid, including: a liquid removing mechanism that blows a gas against a component to which the liquid is adhered in order to remove that liquid, the component disposed in a vicinity of the image plane of the projection optical system; wherein, the liquid removing mechanism blows the gas while changing a flow speed thereof.

According to the present invention, it is possible to form a turbulent flow on the surface of the components by blowing the gas, either intermittently or while varying the flow speed thereof, against the components, which are disposed in the vicinity of the image plane of the projection optical system, thereby satisfactorily removing unnecessary liquid adhering to the components. Accordingly, it is possible to prevent the dropping, scattering, and the like, of the liquid from the components, and the occurrence of adhered residue (water mark) on these components, thereby forming a desired pattern on the substrate with good accuracy.

The exposure apparatus of the present invention is an exposure apparatus that exposes a substrate by filling a liquid between a projection optical system and the substrate, and projecting the image of a pattern onto the substrate through the projection optical system and the liquid, including: a liquid removing mechanism having a vibrating apparatus that vibrates a component in order to remove the liquid adhering to the component, the component disposed in a vicinity of the image plane of the projection optical system.

According to the present invention, vibrating the components, which are disposed in the vicinity of the image plane of the projection optical system, promotes the removal of liquid adhering to the components, and enables the satisfactory removal of unnecessary liquid. Accordingly, it is possible to prevent the dropping, scattering, and the like, of the liquid from the components, and the occurrence of adhered residue (water mark) on these components, thereby forming a desired pattern on the substrate with good accuracy.

The exposure apparatus of the present invention is an exposure apparatus that exposes a substrate by filling a liquid between a projection optical system and the substrate, and projecting the image of a pattern onto the substrate through the projection optical system and the liquid, including: a liquid removing mechanism that removes the liquid that scattered from the substrate during exposure and adhered to a component disposed in a vicinity of the image plane of the projection optical system.

According to the present invention, it is possible, even if the liquid scatters from the substrate to the periphery during immersion exposure, to prevent the problem of reduced exposure accuracy caused by the scattered liquid, and to form the desired pattern on the substrate with good accuracy by removing that scattered liquid.

The exposure apparatus of the present invention is an exposure apparatus that exposes a substrate by filling a liquid between a projection optical system and the substrate, and projecting the image of a pattern onto the substrate through the projection optical system and the liquid, including: a liquid removing mechanism that removes the liquid adhering to the component in parallel with the operation of exposing the substrate, the component disposed in a vicinity of the image plane of the projection optical system.

According to the present invention, it is possible, even if liquid from the substrate scatters and adheres to the components during immersion exposure, to remove the liquid, without reducing the throughput of the entire exposure process, by performing the operation of removing the liquid adhering to the components in parallel with the exposure operation. Furthermore, by removing the liquid adhering to the components, it is possible to prevent the problem of reduced exposure accuracy caused by the adhered liquid, and to form the desired pattern on the substrate with good accuracy.

The exposure apparatus of the present invention is an exposure apparatus that exposes a substrate by filling a liquid between a projection optical system and the substrate, and projecting the image of a pattern onto the substrate through the projection optical system and the liquid, including: a shield member provided on the upper side of a component, that prevents the adherence of the liquid to the component, said component disposed in a vicinity of the image plane of the projection optical system.

According to the present invention, either during the exposure or after (or before) the completion of the exposure of the substrate, the shield member can block the liquid that scattered from the substrate, the liquid that dropped from parts, such as the nozzle, and the like, and it is therefore possible to prevent the problem wherein the liquid adheres to the component that is on the lower side of that shield member. Accordingly, it is possible to prevent the problem of reduced exposure accuracy caused by the liquid adhering to the component, and to form the desired pattern on the substrate with good accuracy.

The exposure apparatus of the present invention is an exposure apparatus that exposes a substrate by filling a liquid between a projection optical system and the substrate, and projecting the image of a pattern onto the substrate through the projection optical system and the liquid, including: a stage that has a holding surface, which holds the substrate, and that is capable of moving with respect to the projection optical system; and a liquid receiving member, which is disposed around the stage, that is set so that the liquid receiving surface is positioned lower than the holding surface.

According to the present invention, the liquid receiving member can receive the liquid that dropped from the end part of the stage, the liquid that dropped from the optical element disposed at the front of the projection optical system and from the lens cell that holds this optical element, and the like, and it is consequently possible to prevent the adherence and scattering of the liquid to locations where the adherence of the liquid is undesirable, such as the drive part of the stage, the base, and the like. Consequently, it is possible to suppress a reduction in the positioning accuracy of the substrate, and to form the desired pattern on the substrate with good accuracy.

The exposure apparatus of the present invention is an exposure apparatus that exposes a substrate by projecting an image onto the substrate through a liquid, which is supplied to the substrate, including: a stage that is capable of holding and moving the substrate; a position detection member, which is provided to the stage, for detecting information related to a position of the stage; and a liquid removing mechanism that removes the liquid adhering to the position detection member.

According to the present invention, it is possible to remove the liquid adhering to the position detection member (e.g., the movable mirror that reflects a measurement beam from the laser interferometer), for detecting information related to the position of the stage, and it is consequently possible to suppress an adverse impact on the measurement of the position of the stage and on the positioning accuracy of the substrate, and to form the desired pattern on the substrate with good accuracy.

The exposure apparatus of the present invention is an exposure apparatus that exposes a substrate by forming an immersion area of liquid on a substrate and projecting an image on the substrate through the liquid of the immersion area, including: a stage apparatus that is capable of holding and moving the substrate; an interferometer that detects a position information of the stage apparatus; and a reflecting surface, which is provided to the stage apparatus, that reflects the measurement beam from the interferometer; wherein, the upper end of the reflecting surface is positioned lower than the immersion area.

The exposure apparatus of the present invention is an exposure apparatus that exposes a substrate by projecting an image on the substrate through a liquid, which is supplied to the substrate, including a substrate holding member that is capable of holding and moving the substrate; an interferometer that detects a position information of the substrate holding member; a plate shaped member, which is installed on the upper surface of the substrate holding member, that is liquid repellant; and a reflecting surface, which is provided to the substrate holding member below the plate shaped member, that reflects the measurement beam from the interferometer; wherein, at least one part of the end part of the plate shaped member protrudes, in the direction in which the measurement beam impinges the reflecting surface, on the incident direction side more than the reflecting surface.

The exposure apparatus of the present invention is an exposure apparatus that forms an image on a substrate by a projection optical system, including: a substrate holding member that is capable of holding and moving, at least within a plane, the substrate; an interferometer that detects a possible information of the substrate holding member within the plane; and a reflecting surface, which is provided to the substrate holding member, that reflects the measurement beam from the interferometer; wherein, at least part of the optical path of the measurement beam which impinges the reflecting surface, passes below at least part of the substrate holding member.

A device fabricating method of the present invention uses the exposure apparatus as recited above. According to the present invention, it is possible to fabricate devices having a desired performance in a state wherein environmental changes, the occurrence of residue adhering to the optical element in a vicinity of the image plane of the projection optical system, and the like, are suppressed.

BRIEF DESCRIPTION OF THE DRAWINGS

FIG. 18 is a schematic view showing another example of the third liquid removing apparatus, which is a liquid removing mechanism.

FIG. 19 is a schematic view showing another example of the third liquid removing apparatus, which is a liquid removing mechanism.

DETAILED DESCRIPTION OF THE INVENTION

Figure 1:
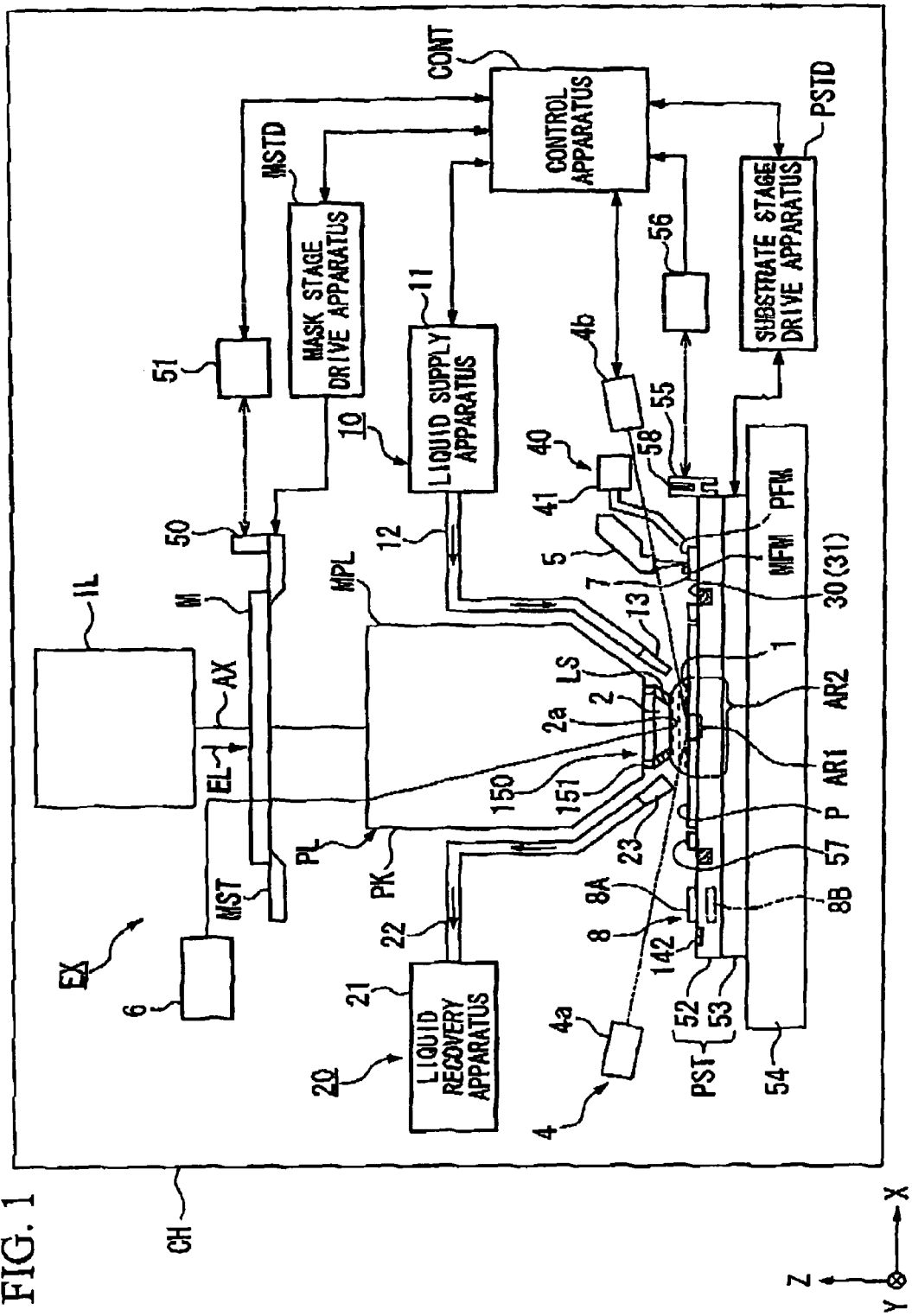
FIG. 1 is a schematic block diagram showing one embodiment of an exposure apparatus of the present invention.

The following explains the exposure apparatus of the present invention, referencing the drawings. FIG. 1 is a schematic block diagram that depicts one embodiment of the exposure apparatus according to the present invention.

In FIG. 1, the exposure apparatus EX includes: a mask stage MST that supports a mask M; a substrate stage PST that supports a substrate P; an illumination optical system IL that illuminates with an exposure light EL the mask M supported by the mask stage MST; a projection optical system PL that projects and exposes a pattern image of the mask M illuminated by the exposure light EL onto the substrate P supported by the substrate stage PST; and a control apparatus CONT that provides overall control of the operation of the entire exposure apparatus EX. The entire exposure apparatus EX is housed within a chamber apparatus CH.

The exposure apparatus EX of the present embodiment is a liquid immersion type exposure apparatus that applies the liquid immersion method to substantially shorten the exposure wavelength, improve the resolution, as well as substantially increase the depth of focus, and includes a liquid supply mechanism 10 that supplies a liquid 1 to the substrate P, and a liquid recovery mechanism 20 that recovers the liquid 1 on the substrate P. In the present embodiment, pure water is used as the liquid 1. At least during the transfer of the pattern image of the mask M onto the substrate P, the exposure apparatus EX forms the immersion area AR2 with the liquid 1, which is supplied by the liquid supply mechanism 10, in at least one part on the substrate P that includes a projection area AR1 of the projection optical system PL. Specifically, the exposure apparatus EX exposes the substrate P by filling the liquid 1 between an optical element 2 at the front part of the projection optical system PL and the surface (exposure surface) of the substrate P, and then projecting the pattern image of the mask M onto the substrate P through the liquid 1 that is between this projection optical system PL and the substrate P, and through the projection optical system PL.

The present embodiment will now be explained as exemplified by a case of using a scanning type exposure apparatus (a so-called scanning stepper) as the exposure apparatus EX that exposes the substrate P with the pattern formed on the mask M while synchronously moving the mask M and the substrate P in the scanning direction (prescribed direction) in mutually different directions (reverse directions). In the following explanation, the direction in which the mask M and the substrate P synchronously move (scanning direction) within the horizontal plane is the X axial direction, the direction orthogonal to the X axial direction within the horizontal plane is the Y axial direction (non-scanning direction), and the direction perpendicular to the X axis and the Y axial direction and that coincides with an optical axis AX of the projection optical system PL is the Z axial direction. In addition, the rotational (inclined) directions around the X, Y, and Z axes are the θX, θY, and θZ directions, respectively. Furthermore, "substrate" herein includes on in which a semiconductor wafer is coated with a photoresist, and "mask" includes a reticle wherein a device pattern, which is reduction projected onto the substrate, is formed.

The illumination optical system IL illuminates with the exposure light EL the mask M supported by the mask stage MST, and includes: an exposure light source; an optical integrator that uniformizes the intensity of the luminous flux emitted from the exposure light source; a condenser lens that condenses the exposure light EL from the optical integrator; a relay lens system; and a variable field stop that sets an illumination region on the mask M illuminated by the exposure light EL to be slit shaped; and the like. The illumination optical system IL illuminates the prescribed illumination region on the mask M with the exposure light EL, which has a uniform illumination intensity distribution. Examples of light that can be used as the exposure light EL emitted from the illumination optical system IL include: deep ultraviolet light (DUV light), such as the bright lines (g, h, and i lines) in the ultraviolet region emitted from a mercury lamp for example, and KrF excimer laser light (248 mm wavelength); and vacuum ultraviolet light (VUV light), such as ArF excimer laser light (193 cm wavelength) and $F_2$ laser light (157 nm wavelength). ArF excimer laser light is used in the present embodiment. As discussed above, the liquid 1 in the present embodiment is pure water, and the exposure light EL can transmit therethrough even if it is light from an ArF excimer laser. In addition, the bright lines (g, h, and i lines) of the ultraviolet region, as well as deep ultraviolet light (DUV light), such as KrF excimer laser light (248 mm wavelength), can also transmit through pure water.

The mask stage MST supports the mask M, and is two dimensionally movable in the plane perpendicular to the optical axis AX of the projection optical system PL, i.e., in the XY plane, and is finely rotatable in the θZ direction. A mask stage drive apparatus MSTD, such as a linear motor, drives the mask stage MST. A movable mirror 50 is provided on the mask stage MST. In addition, a laser interferometer 51 is provided at a position opening the movable mirror 50. The control apparatus CONT controls the mask stage drive apparatus MSTD. A laser interferometer 51 measures in real time the position in the two dimensional direction and the rotational angle of the mask M on the mask stage MST, and outputs these measurement results to the control apparatus CONT. The control apparatus CONT drives the mask stage drive apparatus MSTD based on the measurement results of the laser interferometer 51, thereby positioning the mask M, which is supported by the mask stage MST.

The projection optical system PL projects and exposes the pattern of the mask M onto the substrate P at a prescribed projection magnification β, and includes a projection optical system main body MPL, which includes a plurality of optical elements, and an optical element 2, which is provided at the front part on the substrate P side (on the image plane side of the projection optical system PL). The plurality of optical elements, which constitute the projection optical system main body MPL, are held by a lens barrel PK, and the optical element 2 at the front part of the projection optical system PL is held by a lens cell LS. Furthermore, the lens cell LS that holds the optical element 2 and the front part of the lens barrel PK are coupled by a coupling device 150, which includes a plurality of link parts 151.

In the present embodiment, the projection optical system PL is a reduction system that has a projection magnification β of, for example, ¼ or ⅕. Furthermore, the projection optical system PL may be a unity magnification system or an enlargement system. The front part optical element 2 and the lens cell LS contact the liquid 1 in the immersion area AR2.

The optical element 2 is made of fluorite. Because fluorite has a high affinity for pure water, the liquid 1 can be adhered to substantially the entire surface of a liquid contact surface 2a of the optical element 2. Namely, because the liquid (water) 1 supplied in the present embodiment has a high affinity for the liquid contact surface 2a of the optical element 2, the liquid contact surface 2a of the optical element 2 and the liquid 1 have strong adhesion characteristics, and the optical element 2 may therefore be made of quartz, which has a strong affinity for water. In addition, the liquid contact surface 2a of the optical element 2 may be given hydrophilic (lyophilic) treatment in order to further raise its affinity for the liquid 1.

In addition, the exposure apparatus EX includes a focus detection system 4. In the focus detection system 4, which includes a light emitting part 4a and a light receiving part 4b, detection light is projected from the light emitting part 4a through the liquid 1 from a diagonal direction onto the surface of the substrate P (the exposure surface), and the reflected light thereof is received by the light receiving part 4b. The control apparatus CONT controls the operation of the focus detection system 4 and, based on the light receiving result of the light receiving part 4b, detects the position (the focus position) of the surface of the substrate P with respect to a prescribed reference surface in the Z axial direction. In addition, by deriving a focus position at each of a plurality of points on the surface of the substrate P, the focus detection system 4 can derive the attitude of the substrate P in an inclination direction. Furthermore, it is possible to use as the constitution of the focus detection system 4 the one disclosed in, for example, Japanese Unexamined Patent Application, First Publication No. H08-37149 and the corresponding U.S. Pat. No. 6,327,025. In addition, the disclosures of the abovementioned Japanese publication and the corresponding U.S.

patent are each hereby incorporated by reference in its entirety to the extent permitted by the national laws and regulations of the designated states (or elected states) designated by the present international patent application.

The substrate stage PST supports the substrate P and includes a Z stage 52, which holds the substrate P via a substrate holder, an XY stage 53, which supports the Z stage 52, and a base 54, which supports the XY stage 53. A substrate stage drive apparatus PSTD, such as a linear motor, drives the substrate stage PST. The control apparatus CONT controls the substrate stage drive apparatus PSTD. Furthermore, the Z stage and the XY stage may of course be provided integrally. The position of the substrate P in the XY direction (the position in the direction substantially parallel to the image plane of the projection optical system PL) is controlled by driving the XY stage 53 of the substrate stage PST.

Movable mirrors (reflecting mirrors) 55 are provided to the side portions of the substrate stage PST (Z stage 52). In addition, a laser interferometer 56 is provided at a position opposing each of the movable mirrors 55. Each laser interferometer 56 measures in real time the position in the two dimensional directions and the rotational angle of the substrate P on the substrate stage PST, and these measurement results are output to the control apparatus CONT. Based on the measurement results of each laser interferometer 56, the control apparatus CONT drives the XY stage 53 via the substrate stage drive apparatus PSTD, which positions the substrate P, which is supported by the substrate stage PST, in the X axial direction and the Y axial direction.

In addition, by driving the Z stage 52 of the substrate stage PST via the substrate stage drive apparatus PSTD, the control apparatus CONT controls the position of the substrate P, which is supported by the Z stage 52, in the Z axial direction (focus position) and in the $\theta X$, $\theta Y$ directions. Namely, the Z stage 52 operates based on a command, which is based on the detection results of the focus detection system 4, from the control apparatus CONT, controls the focus position (Z position) and the inclination angle of the substrate P, and aligns the surface thereof (exposure surface) with the image plane formed through the projection optical system PL and the liquid 1.

An auxiliary plate 57 is provided on the substrate stage PST (Z stage 52) so that it surrounds the substrate P. The auxiliary plate 57 includes a flat surface at a height substantially the same as that of the surface of the substrate P held by the substrate holder. Here, there is a gap of approximately 0.1-1 mm between the edge of the substrate P and the auxiliary plate 57, but due to the surface tension of the liquid 1 there is virtually no flow of the liquid 1 into that gap, and the liquid 1 can therefore be held below the projection optical system PL by the auxiliary plate 57, even when exposing the vicinity of the circumferential edge of the substrate P.

In addition, a reference member 7, which has fiducial marks MFM, PFM used in the process of aligning the mask M and the substrate P, is provided on the substrate stage PST (Z stage 52). Furthermore, a substrate alignment system 5, which detects the alignment mark on the substrate P or the fiducial mark PFM provided to the reference member 7, is provided in the vicinity of the front of the projection optical system PL. In addition, a mask alignment system 6 is provided in the vicinity of the mask stage MST and detects, through the mask M and the projection optical system PL, the fiducial mark MFM provided to the reference member 7. Furthermore, the system disclosed in, for example, Japanese Unexamined Patent Application, First Publication No. H04-65603 and the corresponding U.S. Pat. No. 5,493,403 can be used to constitute the substrate alignment system 5, and the system disclosed in Japanese Unexamined Patent Application, First Publication No. H07-176468 and the corresponding U.S. Pat. No. 5,646,413 can be used to constitute the mask alignment system 6.

Furthermore, the disclosures of the abovementioned Japanese publications and corresponding U.S. patents are each hereby incorporated by reference in its entirety to the extent permitted by the national laws and regulations of the designated states (or elected states) designated by the present international patent application.

Furthermore, a light receiving device 8, which receives the light irradiated through the projection optical system PL and onto the image plane side thereof (the substrate P side), is provided on the substrate stage PST (Z stage 52). The light receiving device 8 includes a light transmitting member 8A, which consists of a glass plate provided on the Z stage 52, and a light receiving element 8B, which is embedded in the Z stage 52, that receives light through the light transmitting member 8A.

A first liquid removing apparatus 40, which removes the liquid 1 remaining on and adhered to the reference member 7 provided to the Z stage 52, is provided in the vicinity of the substrate alignment system 5. In addition, a liquid recovery apparatus 30, which recovers the liquid 1, is provided to the substrate stage PST.

The liquid supply mechanism 10 supplies the prescribed liquid 1 onto the substrate P from above in order to form the immersion area AR2, and includes: a liquid supply apparatus 11, which is capable of feeding the liquid 1; and supply nozzles 13, which are connected to the liquid supply apparatus 11 through a supply pipe 12, which has a passageway, that each have a supply port through which the liquid 1, which is fed from this liquid supply apparatus 11, is supplied to the substrate P. The liquid supply apparatus 11 includes a tank that stores the liquid 1, a pressurizing pump, and the like, and supplies the liquid 1 to the substrate P through the supply pipe 12 and the supply nozzles 13. The control apparatus CONT controls the operation wherein the liquid is supplied by the liquid supply apparatus 11, and can independently control the amount of liquid supplied per unit of time to the substrate P by the liquid supply apparatus 11. In addition, the liquid supply apparatus 11 includes a mechanism for adjusting the temperature of the liquid 1, and supplies the substrate P with the liquid 1, which has a temperature (for example, 23° C.) substantially the same as that inside the chamber apparatus CH that houses the apparatus. The supply nozzles 13 are disposed proximate to the substrate P, and supply the liquid 1 to the substrate P from above it. In addition, the supply nozzles 13 contact the liquid 1 in the immersion area AR2 during immersion exposure.

The liquid recovery mechanism 20 recovers the liquid 1 on the substrate P from above it, and includes recovery nozzles 23, which each have a recovery port disposed proximate to the surface of the substrate P, and a liquid recovery apparatus 21, which is connected to the recovery nozzles 23 through a recovery pipe 22 that has a passageway. The liquid recovery apparatus 21 includes a vacuum system (suction apparatus), e.g., a vacuum pump, a tank that stores the recovered liquid 1, and the like, and recovers the liquid 1 on the substrate P through the recovery nozzles 23 and the recovery pipe 22. The control apparatus CONT controls the operation of recovering the liquid by the liquid recovery apparatus 21, and can control the amount of liquid recovered per unit of time thereby. The recovery nozzles 23 contact the liquid 1 in the immersion area AR2 during immersion exposure, and the liquid recovery mechanism 20 sucks and recovers the liquid 1 on the substrate P from above it through the recovery nozzles 23.

Figure 2:
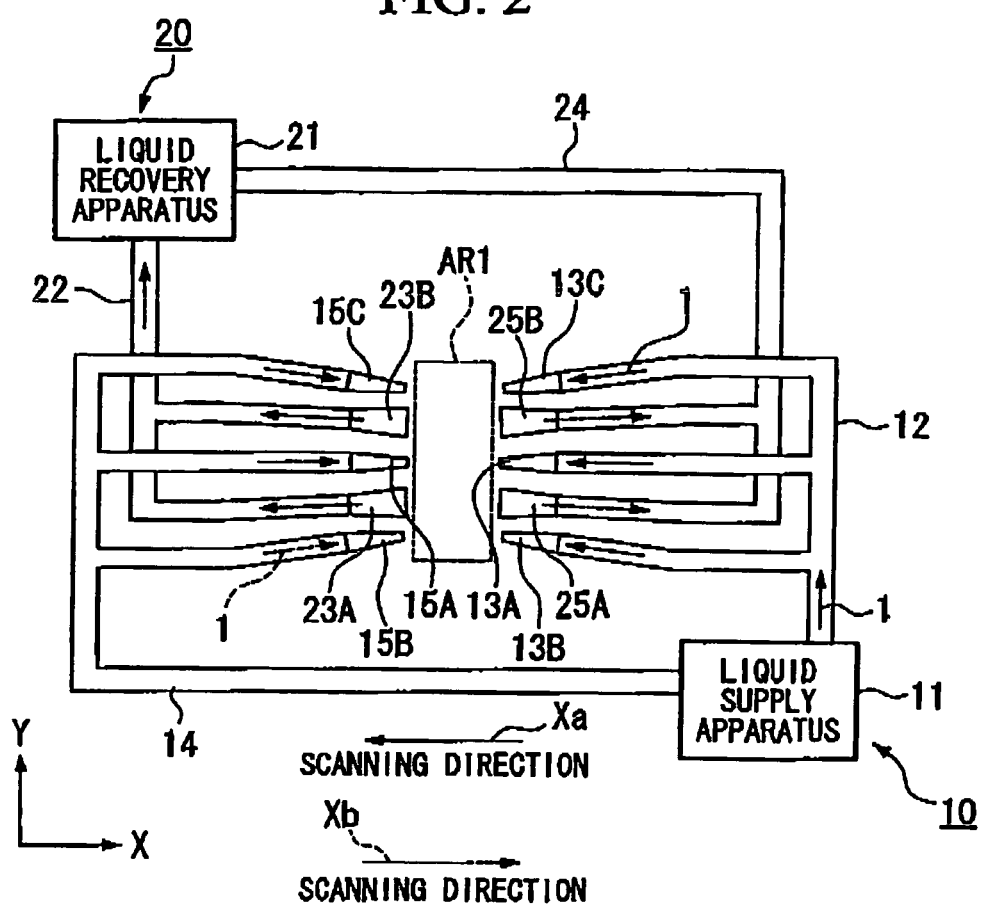
FIG. 2 is a schematic block diagram showing a liquid supply mechanism and a liquid recovery mechanism for forming an immersion area.

FIG. 2 depicts the positional relationships between the projection area AR1 of the projection optical system PL, the supply nozzles 13 (13A-13C) that supply the liquid 1 in the X axial direction, and the recovery nozzle 23 (23A-23B) that recover the liquid 1. In FIG. 2, the shape of the projection area AR1 of the projection optical system PL is a rectangle that is long and thin in the Y axial direction, and part of the pattern image of the mask M is projected to that projection areas AR1. Three supply nozzles 13A-13C are disposed on the +X direction side, and two recovery nozzles 23A, 23B are disposed on the −X direction side so that the projection area AR1 is interposed therebetween in the X axial direction. Furthermore, the supply nozzles 13A-13C are connected to the liquid supply apparatus 11 via the supply pipe 12, and the recovery nozzles 23A, 23B are connected to the liquid recovery apparatus 21 via the recovery pipe 22. In addition, supply nozzles 15A-15C and recovery nozzles 25A, 25B are disposed at positions obtained by rotating, by substantially 180°, the positions of the supply nozzles 13A-13C and the recovery nozzles 23A, 23B. The supply nozzles 13A-13C and the recovery nozzles 25A, 25B are arrayed alternately in the Y axial direction, the supply nozzles 15A-15C and the recovery nozzles 23A, 23B are arrayed alternately in the Y axial direction, the supply nozzles 15A-15C are connected to the liquid supply apparatus 11 via a supply pipe 14, and the recovery nozzles 25A, 25B are connected to the liquid recovery apparatus 21 via a recovery pipe 24.

Further, the substrate P moves in the +X direction (or −X direction) at a speed β·V (where β is the projection magnification) via the XY stage 53, which is synchronized to the movement of the mask M at the speed V in the −X direction (or +X direction) with respect to the projection optical system PL. After the exposure of one shot region is completed, the next shot region moves to the scanning start position by the stepping of the substrate P, and the exposure process is then successively performed for each shot region by the step-and-scan system.

In the present embodiment, the control apparatus CONT flows the liquid 1 along the movement direction of the substrate P. For example, if scanning exposure is being performed by moving the substrate P in the scanning direction (−X direction) depicted by, for example, the arrow Xa, then the liquid 1 is supplied and recovered by the liquid supply apparatus 11 and the liquid recovery apparatus 21 using the supply pipe 12, the supply nozzles 13A-13C, the recovery pipe 22, and the recovery nozzles 23A, 23B. Namely, when the substrate P moves in the −X direction, the liquid 1 is supplied from the liquid supply apparatus 11, through the supply pipe 12 and the supply nozzles 13 (13A-13C), between the projection optical system PL and the substrate P, is recovered by the liquid recovery apparatus 21 through the recovery nozzles 23 (23A, 23B) and the recovery pipe 22, and thereby flows in the −X direction so that it fills the space between the optical element 2 and the substrate P. Meanwhile, if scanning exposure is performed by moving the substrate P in the scanning direction (+X direction) depicted by the arrow Xb, then the liquid 1 is supplied and recovered by the liquid supply apparatus 11 and the liquid recovery apparatus 21 using the supply pipe 14, the supply nozzles 15A-15C, the recovery pipe 24, and the recovery nozzles 25A, 25B. Namely, when the substrate P moves in the +X direction, the liquid 1 is supplied from the liquid supply apparatus 11, through the supply pipe 14 and the supply nozzles 15 (15A-15C), between the projection optical system PL and the substrate P, is recovered by the liquid recovery apparatus 21 through the recovery nozzles 25 (25A, 25B) and the recovery pipe 24, and thereby flows in the +X direction so that it fills the space between the optical element 2 and the substrate P. Thus, the control apparatus CONT uses the liquid supply apparatus 11 and the liquid recovery apparatus 21 to flow the liquid 1 along the movement direction of the substrate P in a direction identical thereto. In this case, the liquid 1, which is supplied, for example, from the liquid supply apparatus 11 through the supply nozzles 13, flows with the movement of the substrate P in the −X direction so that it is drawn into the space between the projection optical system PL and the substrate P, and it is therefore possible to easily supply the liquid 1 thereto even if the supplied energy of the liquid supply apparatus 11 is small. Furthermore, by switching the direction of flow of the liquid 1 in accordance with the scanning direction, it is possible to fill the liquid 1 between the optical element 2 at the front part of the projection optical system PL and the substrate P, and to obtain a high resolution and great depth of focus regardless of whether the substrate P is scanned in the +X direction or the −X direction.

Furthermore, the present invention is not particularly limited to the configuration of the nozzles discussed above, and the liquid 1 may be supplied and recovered by, for example, two pairs of nozzles disposed along the long sides of the projection area AR1. Furthermore, in this case, the liquid 1 can also be supplied and recovered from either the +X direction or the −X direction, and the supply nozzles and the recovery nozzles may consequently be arrayed vertically. In addition, the nozzles that supply and recover the liquid 1 are provided at prescribed intervals around the optical element 2 of the projection optical system PL, and it is therefore possible to flow the liquid 1 in a direction parallel to and the same as the movement direction of the substrate P, even if the substrate P moves in a direction other than the scanning direction (the +X direction and the −X direction).

Figure 3:
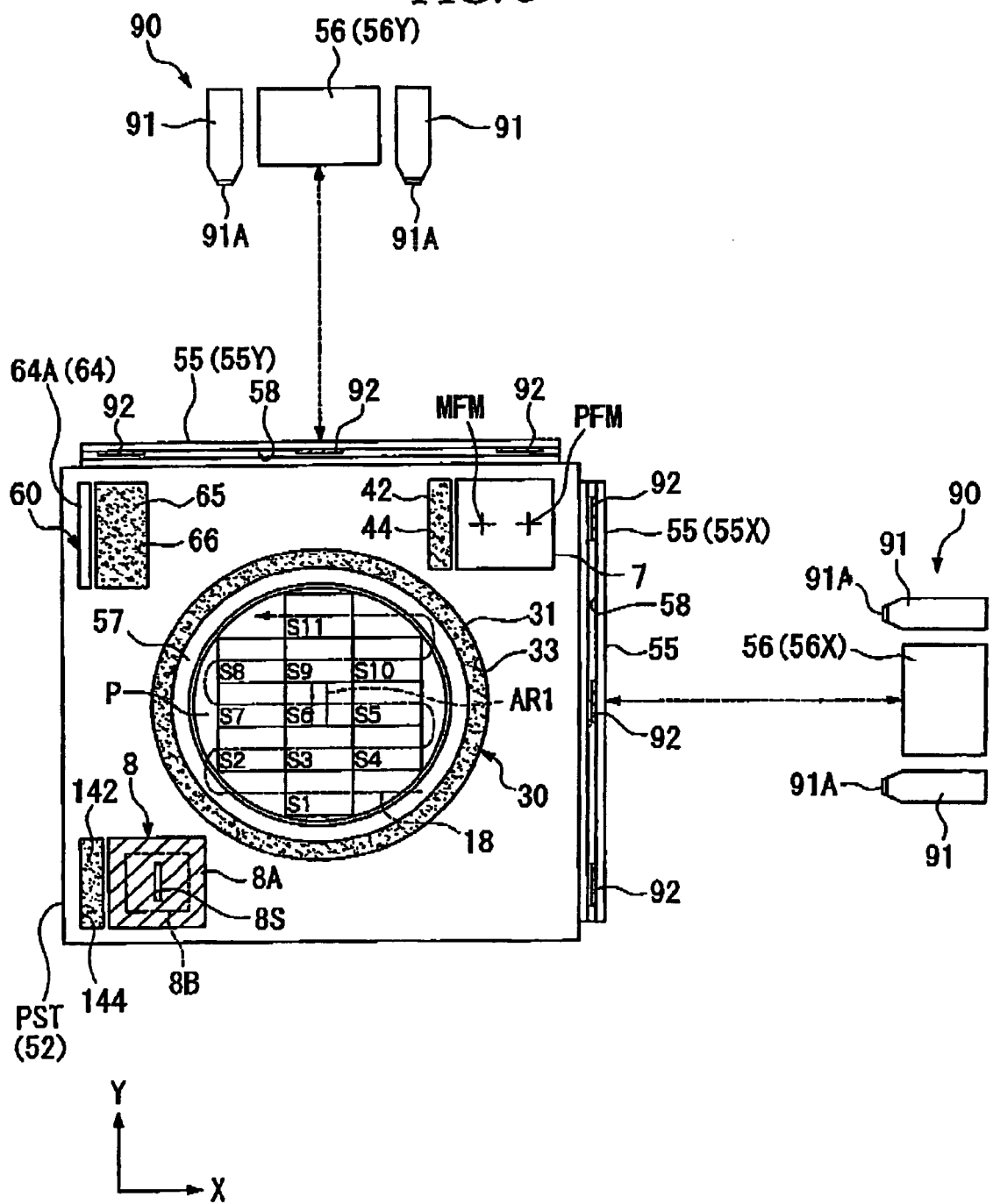
FIG. 3 is a plan view showing a substrate stage.

FIG. 3 is a schematic plan view of the Z stage 52 of the substrate stage PST, viewed from above. The movable mirrors 55 (55X, 55Y) are disposed on two mutually perpendicular side surfaces of the rectangular Z stage 52. Specifically, the movable mirror 55X is provided to the end part of the Z stage 52 on the +X side so that it extends in the Y axial direction, and the movable mirror 55Y is provided to the end part of the Z stage 52 on the +Y side so that it extends in the X axial direction. Furthermore, the substrate P is held via a holder (not shown) at substantially the center of the Z stage 52.

The laser interferometers 56 (56X, 56Y), which irradiate the movable mirrors 55 with the laser light (measurement beam), are disposed at a position opposing the movable mirrors 55 (55X, 55Y), respectively. Furthermore, blow out nozzles 91 are provided in the vicinity of each of the laser interferometers 56, which are on the outer side of the substrate stage PST, and each blow out nozzle 91 includes a gas blow out port 91A and constitutes part of a second liquid removing apparatus 90, which removes the liquid 1 adhering to the corresponding movable mirror 55 by blowing the gas thereagainst. In the present embodiment, the blow out nozzles 91 are provided on both sides of, and sandwiches, each laser interferometer 56.

A groove part (upper groove part) 58 is formed at the upper part of each movable mirror 55 along the longitudinal direction thereof. Vibrating apparatuses 92 are provided at a plurality of prescribed positions on the inner side of the groove part 58 of each movable mirror 55 and vibrates such. In the present embodiment, each vibrating apparatus 92 is made of a piezoelectric film, which is a piezoelectric device, and is affixed at each of three locations along the longitudinal direction at the center portion and at both end portions of the groove part 58 of each movable mirror 55. Furthermore, the installation position and the number of piezoelectric films 92 can be arbitrarily set.

The auxiliary plate 57, which has a flat surface at a height substantially the same as that of the surface of the substrate P as discussed above, is provided around the substrate P. Furthermore, a liquid absorbing member 31, which constitutes part of the stage liquid recovery apparatus 30 that recovers the liquid 1, is provided around the auxiliary plate 57. The liquid absorbing member 31 is an annular member that has a prescribed width, and is disposed in a groove part (recovery port) 33 annularly formed in the Z stage 52. The liquid absorbing member 31 is made of a porous material, e.g., porous ceramics or the like. Alternatively, sponge, which is a porous material, may be used as the material for forming the liquid absorbing member 31. The liquid absorbing member 31 that is made of a porous material can hold a prescribed amount of the liquid 1.

The reference member 7 is provided at one corner of the Z stage 52. The fiducial mark PFM, which is detected by the substrate alignment system 5, and the fiducial mark MFM, which is detected by the mask alignment system 6, are provided to the reference member 7 with a prescribed positional relationship. In addition, the surface of the reference member 7 is substantially flat and serves the role of a reference surface of the focus detection system 4.

Furthermore, the reference surface of the focus detection system 4 may be provided on the Z stage 52 separately from the reference member 7. In addition the reference member 7 and the auxiliary plate 57 may be integrally provided.

Furthermore, a liquid absorbing member 42, which recovers the liquid 1 removed from the reference member 7 by the first liquid removing apparatus 40, is provided on the Z stage 52 in the vicinity of the reference member 7. The liquid absorbing member 42 is disposed in a groove part 44, which is formed in the Z stage 52. Furthermore, a gas blow out port 64A of a nozzle part 64 that constitutes part of a third liquid removing apparatus 60, which removes the liquid 1 that remains on and adheres to the optical element 2 at the front part of the projection optical system PL and the lens cell LS that holds this optical element 2, is disposed at a separate corner of the Z stage 52, and a liquid absorbing material 65, which recovers the liquid 1 removed from the optical element 2, is provided in the vicinity of that gas blow out port 64A. The liquid absorbing material 65 is disposed in a groove part 66 formed in the Z stage 52.

Furthermore, the light transmitting member 8A is provided at a separate corner of the Z stage 52, and constitutes part of the light receiving device 8 that receives the light irradiated through the projection optical system PL to the image plane side (the substrate P side) thereof. The light transmitting member 8A is patterned with a film that includes a light shielding material, such as chromium, on the surface of a glass plate, and at the center part thereof is provided a slit part 8S, which is a light transmitting part with its longitudinal direction in the Y axial direction. The light irradiated through the projection optical system PL to the image plane side thereof passes through the slit 8S and is received by the light receiving element 8B, which is embedded in the Z stage 52. Furthermore, a liquid absorbing member 142, which recovers the liquid 1 removed from the light transmitting member 8A, is provided on the Z stage 52 in the vicinity of the light transmitting member 8A. The liquid absorbing member 142 is disposed in a groove part 144, which is formed in the Z stage 52.

Figure 4:
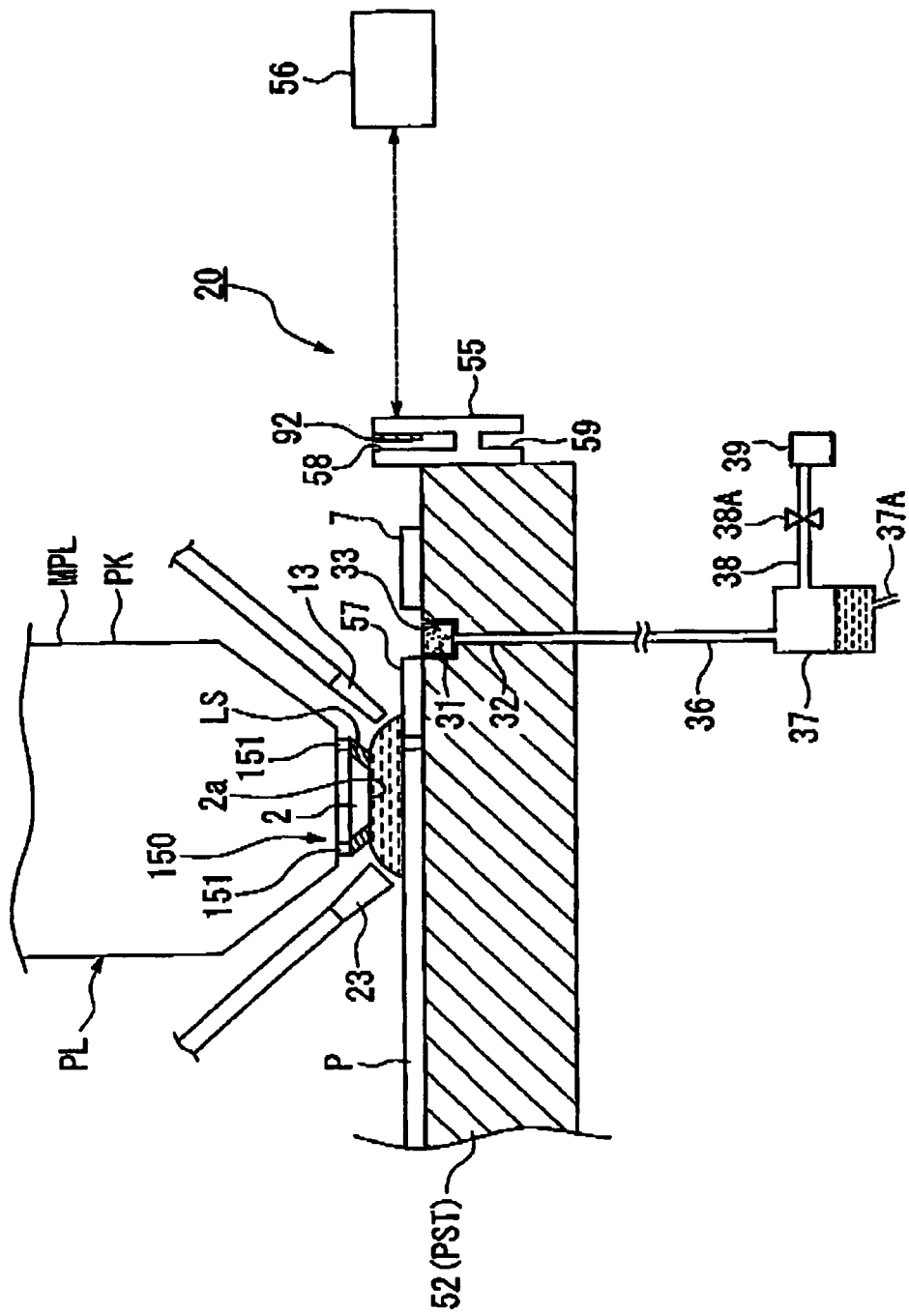
FIG. 4 shows one example of a stage liquid recovery apparatus.

FIG. 4 is a cross sectional view that depicts the stage liquid recovery apparatus 30. The stage liquid recovery apparatus 30 includes: the above discussed liquid absorbing member 31, which is disposed in the groove part (recovery part) 33 formed annularly in the Z stage 52; a passageway 32 formed inside the Z stage 52 and continuous with the groove part 33; a conduit 36 provided external to the Z stage 52 and wherein one end is connected to the passageway 32; a tank 37 connected to the other end of the conduit 36 and provided external to the Z stage 52; and a pump 39, which is a vacuum system (suction apparatus), connected to this tank 37 through a conduit 38 that has a valve 38A. The tank 37 is provided with a discharge passageway 37A, and is constituted so that the liquid 1 is discharged from the discharge passageway 37A when a prescribed amount has accumulated. Furthermore, in the stage liquid recovery apparatus 30, the pump 39 is driven, which collects the liquid 1 recovered by the liquid absorbing member 31 so that it is sucked into the tank 37.

The following explains the procedure for using the exposure apparatus EK, which is discussed above, to expose the substrate P with the pattern of the mask M.

Before supplying the liquid 1 from the liquid supply mechanism 10, the measurement process is first performed in a state wherein there is no liquid 1 on the substrate P. The control apparatus CONT moves the XY stage 53 while monitoring the outputs of the laser interferometers 56 so that the optical axis AX of the projection optical system PL proceeds along a broken line arrow 18 in FIG. 3. During that movement, the substrate alignment system 5 detects, although not through the liquid 1, a plurality of alignment marks (not shown) formed on the substrate P corresponding to shot regions S1-S11. Furthermore, the XY stage 53 stops when the substrate alignment system 5 detects an alignment mark. As a result, the position information of each alignment mark is measured within a coordinate system defined by the laser interferometers 56. Furthermore, the substrate alignment system 5 may detect all, or a portion of, the alignment marks on the substrate P.

In addition, during the movement of the XY stage 53, the focus detection system 4 detects, although not through the liquid 1, the surface information of the substrate P. The focus detection system 4 detects the surface information for all shot regions S1-S11 on the substrate P, and stores the detection results in the control apparatus CONT associated with the position on the substrate P in the scanning direction (X axial direction). Furthermore, the focus detection system 4 may detect the surface information of just a portion of the shot regions.

When the detection of the alignment marks on the substrate P and of the surface information of the substrate P are complete, the control apparatus CONT moves the XY stage 53 so that the detection area of the substrate alignment system 5 is positioned on the reference member 7. The substrate alignment system 5 detects the fiducial mark PFM on the reference member 7, and measures the position information of the fiducial mark PFM within the coordinate system defined by the laser interferometers 56.

The positional relationships between the fiducial mark PFM and the plurality of alignment marks on the substrate P, i.e., the positional relationships between the fiducial mark PFM and the plurality of shot regions S1-S11 on the substrate P, are each derived by the completion of the process of detecting the fiducial mark PFM. In addition, because the fiducial mark PFM and the fiducial mark MFM are in a prescribed positional relationship, the positional relationships between the fiducial mark MFM and the plurality of shot regions S1-S11 on the substrate P are each determined within the XY plane.

In addition, before and after the detection of the fiducial mark PFM by the substrate alignment system 5, the control apparatus CONT detects the surface information of the reference member 7 (the reference surface) by the focus detection system 4. The relationship between the surface of the reference member 7 and the surface of the substrate P is derived by completing the process of detecting the surface of this reference member 7.

Next, the control apparatus CONT moves the XY stage 53 so that the fiducial mark MFM on the reference member 7 can be detected by the mask alignment system 6. As might be expected, the front part of the projection optical system PL opposes the reference member 7 in this state. At this point, the control apparatus CONT starts the supply and recovery of the liquid 1 by the liquid supply mechanism 10 and the liquid recovery mechanism 20, and forms the immersion area by filling the liquid 1 between the projection optical system PL and the reference member 7.

Next, the control apparatus CONT detects the fiducial mark MFM by the mask alignment system 6 through the mask M, the projection optical system PL, and the liquid 1. Thereby, the fiducial mark MFM is used to detect, through the projection optical system PL and the liquid 1, the position of the mask M within the XY plane, i.e., the projection position information of the pattern image of the mask M.

When the above measurement process is complete, the control apparatus CONT stops the operation of supplying the liquid 1 to the reference member 7 by the liquid supply mechanism 10. However, the control apparatus CONT continues the operation of recovering the liquid 1 on the reference member 7 by the liquid recovery mechanism 20 for a prescribed time period. Then, the control apparatus CONT stops the recovery operation by the liquid recovery mechanism 20 after the above prescribed time period has elapsed, and moves the substrate stage PST in order to remove the liquid 1 that was not completely recovered by the liquid recovery mechanism 20 and therefore remains on the reference member 7.

Figure 5A:
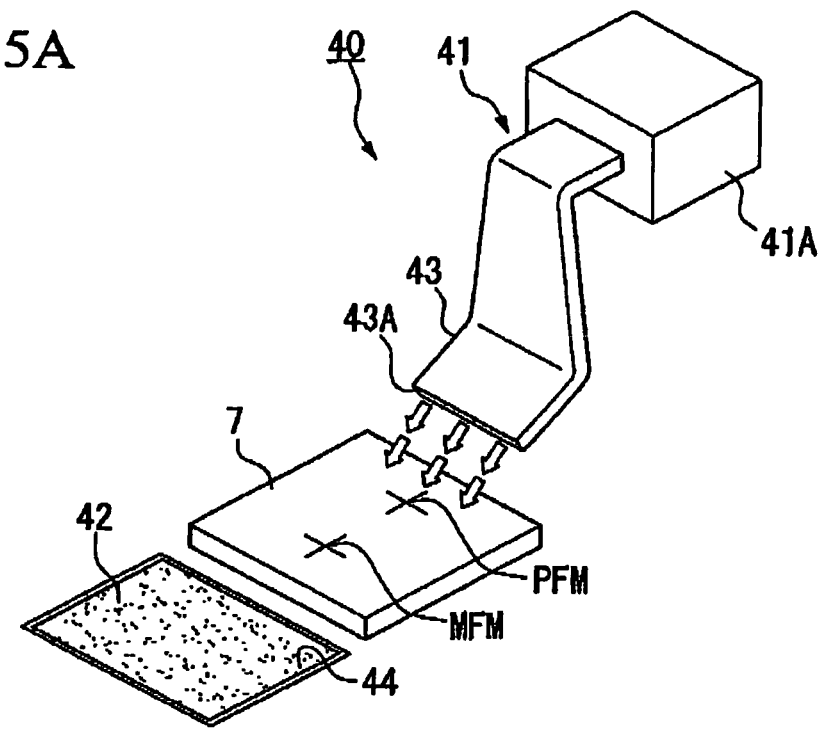
FIG. 5A and FIG. 5B are schematic views showing one example of a first liquid removing apparatus, which is a liquid removing mechanism.
Figure 5B:
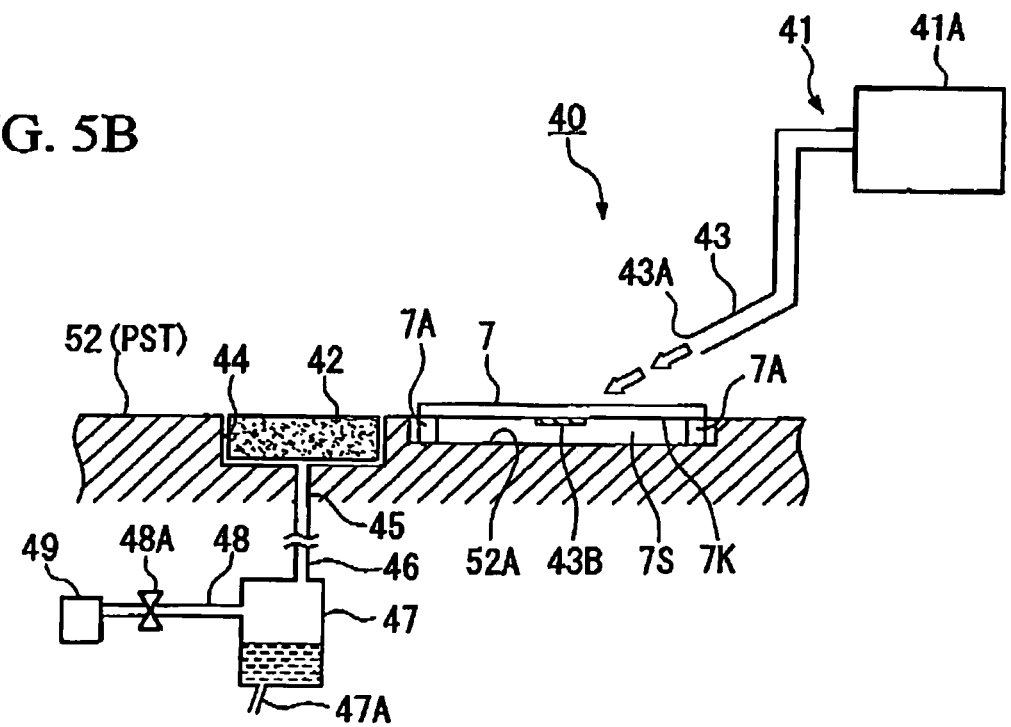

FIGS. 5A and 5B depict an aspect wherein the first liquid removing apparatus 40 removes the liquid 1 remaining on the reference member 7, which is provided on the substrate stage PST (Z stage 52); FIG. 5A is a schematic oblique view, and FIG. 5B is a cross sectional view. In FIG. 5A and FIG. 5B, the first liquid removing apparatus 40 includes a blowing apparatus 41 that blows the gas against the reference member 7, and a vibrating apparatus 43B that vibrates the reference member 7. As depicted in FIG. 5B, the reference member 7 is supported by a support part 7A, which is installed in a recessed part 52A formed in the Z stage 52, and a space 7S is formed between the reference member 7 and the recessed part 52A. The reference member 7 is a plate shaped member, and the support part 7A supports the edge parts of the lower surface 7K of the reference member 7. Furthermore, the vibrating apparatus 43B is provided at the center part of the lower surface 7K of the reference member 7. The vibrating apparatus 43B includes a piezoelectric device, and the control apparatus CONT uses this piezoelectric device 43B to vibrate the reference member 7 by applying a prescribed voltage to the piezoelectric device (vibrating apparatus) 43B.

The blowing apparatus 41 includes a gas supply part 41A, which is capable of feeding the gas, and a nozzle part 43, which is connected to the gas supply part 41A. A gas blow out port 43A of the nozzle part 43 is formed in a slit shape, and is disposed proximate to the reference member 7. The gas supply part 41A and the nozzle part 43 are supported by a support part (not shown), which is independent of the projection optical system PL.

The liquid absorbing member 42, which recovers (holds) the liquid removed from the reference member 7 by the first liquid removing apparatus 40, is provided on the Z stage 52 at a position proximate to the reference member 7. The liquid absorbing member 42 is provided at a position opposing the gas blow out port 43A of the nozzle part 43 so that the reference member 7 is interposed therebetween. The liquid absorbing member 42 is disposed in the groove part 44, which is a recovery port provided in the Z stage 52. Like the liquid absorbing member 31 of the stage liquid recovery apparatus 30, the liquid absorbing member 42 is made of a porous material, e.g., porous ceramics, sponge, or the like, and is capable of holding a prescribed amount of the liquid 1.

The gas supply part 41A feeds the gas, and high speed gas is thereby blown, from a diagonal direction, through the slit shaped gas blow out port 43A of the nozzle part 43 against the reference member 7. The control apparatus CONT blows off and removes the liquid 1 remaining on and adhered to the reference member 7 by blowing the gas from the nozzle part 43 of the first liquid removing apparatus 40 against the reference member 7. At this time, the control apparatus CONT blows the gas from the nozzle part 43 against the reference member 7 while moving the substrate stage PST (i.e., the reference member 7) with respect to the nozzle part 43 (gas blow out port 43A) of the first liquid removing apparatus 40, and the gas can thereby be blown against the entire surface of the reference member 7 without missing any part. The liquid 1 that was blown off is held (recovered) by the liquid absorbing member 42, which is disposed at a position opposing the gas blow out port 43A of the nozzle part 43.

In the present embodiment, the gas from the gas blow out port 43A of the nozzle part 43 is blown against the reference member 7, while using the piezoelectric device 43B to vibrate the reference member 7. Vibrating the reference member 7 promotes the removal (shaking off) of the liquid 1 and such can be satisfactorily removed from the reference member 7 by blowing the gas thereagainst.

A passageway 45, which is continuous with the groove part 44, is formed inside the Z stage 52, and the bottom part of the liquid absorbing member 42, which is disposed in the groove part 44, is connected to the passageway 45. The passageway 45, which is connected to the groove part 44 wherein the liquid absorbing member 42 is disposed, is connected to one end of a conduit 46 that is provided external to the Z stage 52. Meanwhile, the other end of the conduit 46 is connected to a pump 49, which is a suction apparatus, through a tank 47 provided external to the Z stage 52 and a conduit 48 that has a valve 48A. A discharge passageway 47A is provided to the tank 47 and is constituted so that the liquid 1 discharges from the discharge passageway 47A when a prescribed amount accumulates. Then, the control apparatus CONT drives the gas supply part 41A of the first liquid removing apparatus 40 and drives the pump 49, and the liquid 1 recovered by the liquid absorbing member 42 is thereby collected so that it is sucked into the tank 47. Namely, the liquid absorbing member 42, the tank 47, the pump 49; and the like constitute a liquid recovery mechanism that recovers the liquid 1 removed from the reference member 7.

Subsequently, in order to expose each of the shot regions S1-S11 on the substrate P, the control apparatus CONT moves the XY stage 53 so as to mutually oppose the projection optical system PL and the substrate P. After mutually opposing the projection optical system PL and the substrate P, the control apparatus CONT drives the liquid supply mechanism 10 to start the operation of supplying the liquid onto the substrate P. The liquid, which is fed from the liquid supply apparatus 11 of the liquid supply mechanism 10 in order to form the immersion area AR2 on the substrate P, is distributed through the supply pipe 12, and then supplied onto the substrate P through the supply nozzles 13, thereby forming the immersion area AR2 between the projection optical system PL and the substrate P. The liquid 1 supplied onto the substrate P forms the immersion area AR2, which has an area that is at least as large as the projection area AR1, on the substrate P. In addition, the control apparatus CONT controls the liquid recovery apparatus 21 of the liquid recovery mechanism 20, and the liquid supply mechanism 10 performs the operation of recovering the liquid on the substrate P in parallel with the operation of supplying the liquid 1. In other words, in order to form the immersion area AR2 during the exposure of the substrate P, the control apparatus CONT simultaneously performs the operations of supplying the liquid by the liquid supply mechanism 10 and recovering the liquid by the liquid recovery mechanism 20. The liquid 1 on the substrate P is recovered from the recovery port of the recovery nozzles 23.

Then, each of the shot regions S1-S11 on the substrate P is scanning exposed using the various information derived during the previously discussed measurement process. Namely, during the scanning exposure of each of the shot regions S1-S11, each shot region on the substrate P is aligned with the mask M based on: the information of the positional relationship between the fiducial mark PFM and each of the shot regions S1-S11 derived before supplying the liquid 1; and the projection position information of the pattern image of the mask M derived using the fiducial mark MFM after supplying the liquid 1.

In addition, during the scanning exposure of each of the shot regions S1-S11, the positional relationship between the surface of the substrate P and the image plane formed through the liquid 1 is adjusted, without using the focus detection system 4, based on the surface information of the substrate P, which was derived before supplying the liquid 1.

During the scanning exposure of each of the shot regions S1-S11, the liquid from the immersion area AR2 formed on the substrate P may scatter to the outer side of the substrate P. For example, if the liquid 1 that scatters from the substrate P during the exposure thereof adheres to the reflecting surfaces of the movable mirrors 55, then the measurement beam irradiated thereupon the laser interferometers 56 will scatter or the like due to the liquid 1 adhering to the movable mirrors 55, and there is a possibility that it will no longer be possible to accurately measure the position of the substrate stage PST by the laser interferometers 56. Accordingly, when the control apparatus CONT has determined that the liquid 1, which scattered from the substrate P, has adhered to the movable mirrors 55, it starts the process of removing the liquid from the movable mirrors 55 by the second liquid removing apparatuses 90.

At this point, when the laser interferometers 56 irradiates the movable mirror 55 with the measurement beam, the amount of reflected light from that movable mirror 55 received by the laser interferometer 56 is reduced if the liquid 1 has adhered to the movable mirror 55. The control apparatus CONT can determine whether the liquid 1 has adhered to the movable mirror 55 based on the measurement result (light receiving result) of the laser interferometer 56, i.e., based on the amount of reflected light received from that movable mirror 55.

For example, if it is determined that the liquid 1 has adhered to the movable mirrors 55 during the exposure of the sixth shot region S6, then, after the scanning exposure of the sixth shot region S6 is complete, the control apparatus CONT performs the process of removing the liquid by the second liquid removing apparatus 90 during the time period before the start of the scanning exposure of the following seventh shot region S7.

Figure 6:
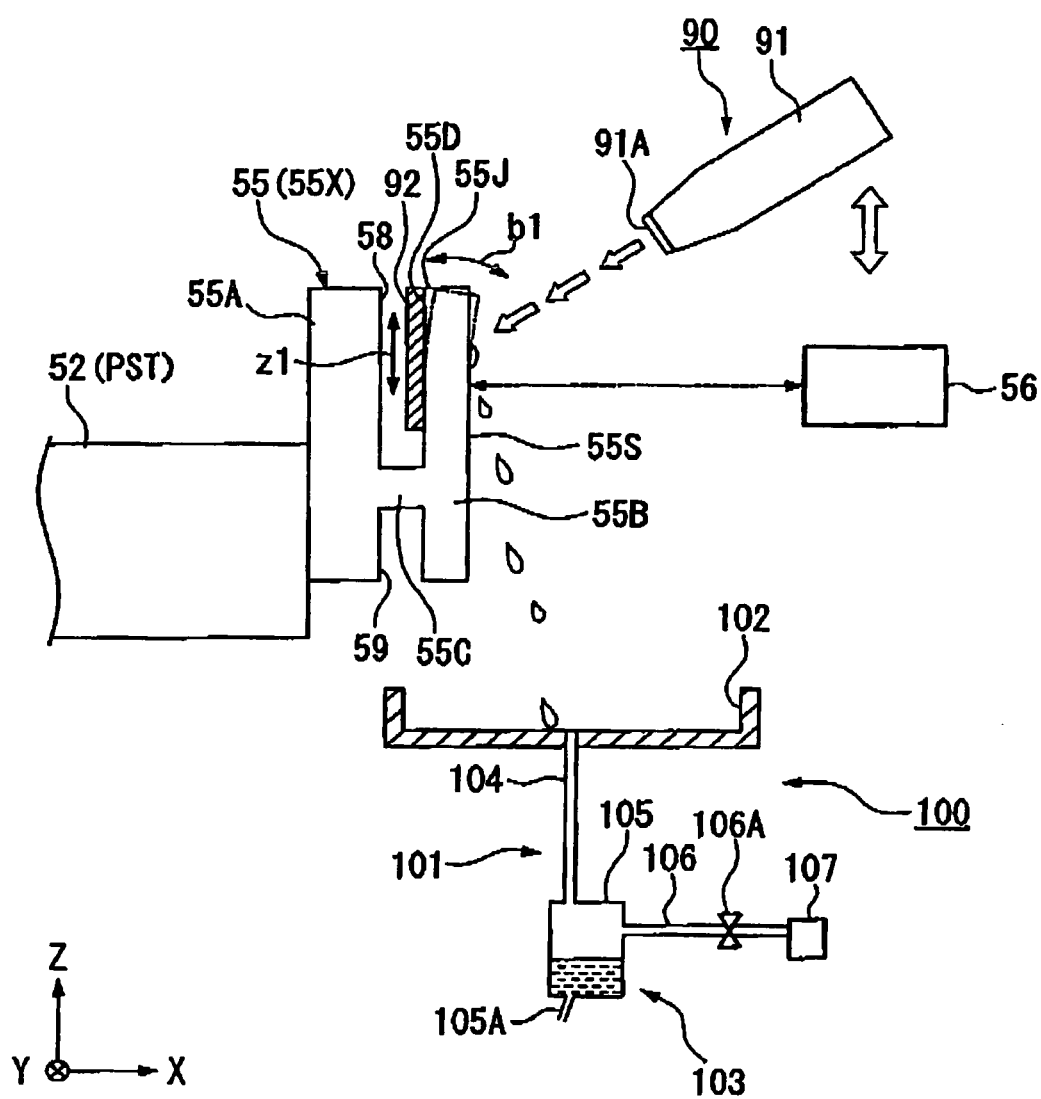
FIG. 6 is a schematic view showing one example of the operation of a second liquid removing apparatus, which is a liquid removing mechanism.

FIG. 6 is a cross sectional view that depicts the operation of using the second liquid removing apparatuses 90 to remove the liquid 1 that has adhered to the movable mirror 55 (55X). Furthermore, the following explains the case of removing the liquid 1 adhering to the movable mirror 55X that is provided to the end part of the Z stage 52 on the +X side, but a similar operation is executed also for the case of removing the liquid 1 adhering to the movable mirror 55Y that is provided to the end part of the Z stage 52 on the +Y side.

In FIG. 6, the movable mirror 55 (55X) includes an upper groove part 58 that is formed in the upper part of the movable mirror 55 (55X) in a notch shape along the longitudinal direction (Y axial direction) thereof, and a lower groove part 59 that is formed in the lower part of the movable mirror 55 (55X) in a notch shape along the longitudinal direction thereof, and substantially forms an H shape in a cross sectional view. Within the movable mirror 55 formed in an H shape in a cross sectional view, an inner side flange part 55A, which is formed on one side of a web part 55C, is connected to the Z stage 52, and an outer side surface 55S of an outer side flange part 55B, which is formed on the other side of the web part 55C, includes a reflecting surface for the measurement beam irradiated by the laser interferometer 56. Furthermore, the outer side flange part 55B of the movable mirror 55 is supported at the center part in the height direction (Z axial direction) thereof by the web part 55C, and an upper end part 55J constitutes a free end. The measurement beam from the laser interferometer 56 is irradiated upon the vicinity of the upper end part 55J (namely, in the vicinity of the free end) of the reflecting surface (outer side surface) 55S of the outer side flange part 55B. Furthermore, the entirety of the movable mirror 55 is made of ceramics, optical glass, or the like, and a reflecting surface is formed on the outer side surface 55S by vacuum depositing thereupon a material that has light reflecting properties, such as a metal.

The second liquid removing apparatus 90 includes the blow out nozzle 91, which is provided in the vicinity of the laser interferometer 56 and has the gas blow out port 91A, and the piezoelectric film (vibrating apparatus) 92, which is provided on the inner side of the groove part 58 of the movable mirror 55 and that vibrates such. The piezoelectric film 92 is affixed to an inner side surface 55D, which faces the groove part 58, of the outer side flange part 55B that has the reflecting surface 55S of the movable mirror 55. More specifically, the piezeoelectric film 92 is affixed at the vicinity of the upper end part 55J, which is the free end of the vibrations, of the inner side surface 55D of the outer shape flange part 55B. The piezoelectric film 92 is constituted so that it expands and contracts in the vertical direction (Z axial direction), as depicted by the arrow z1 in FIG. 6, in a state affixed to the inner side surface 55D, and the expanding and contracting operation of this piezoelectric film 92 vibrates the vicinity of the upper end part 55J of the outer side flange part 55B, with the web part (support part) 55C as the base end, in the θY direction as depicted by the arrow b1. Vibrating the outer side flange part 55B by the piezoelectric film 92 promotes the removal of the liquid 1 adhering to the outer side flange part 55B (reflecting surface 55S). In particular, by vibrating the vicinity of the upper end part 55J, which is the free end of the outer side flange part 55B, the position at which the measurement beam from the laser interferometer 56 irradiates the reflecting surface 55S is particularly vibrated, and the liquid 1 adhering at the position where the measurement beam irradiates the reflecting surface 55S (i.e., the vicinity of the upper end part 55J) can be satisfactorily removed.

Blow out nozzles 91 are provided respectively on both sides of each laser interferometer 56 (refer to FIG. 3), and the gas blow out parts 91A blow the gas against the movable mirror 55 from the diagonally upward direction. Each blow out nozzle 91 is provided movable in the vertical direction (Z axial direction) by a drive mechanism (not shown), and the gas can therefore be blown against the movable mirror 55 without missing any part.

A second liquid recovery mechanism 100, which recovers the liquid 1 removed from the movable mirror 55, is provided on the outer side of the substrate stage PST. The second liquid recovery mechanism 100 includes a processing mechanism 101, which is provided on the outer side of the substrate stage PST, that processes the liquid 1 removed and dropped from the movable mirror 55. The processing mechanism 101 is provided on the outer side of the substrate stage PST below the blow out nozzle 91, and includes a drain member 102 that recovers the liquid 1, and a discharge mechanism 103 that discharges the liquid 1 recovered by the drain member 102. The discharge mechanism 103 includes a tank 105, which is connected to the drain member 102 through a conduit 104, and a pump 107, which is a vacuum system (suction apparatus), that is connected to the tank 105 through a conduit 106. A valve 106A, which opens and closes the passageway of the conduit 106, is provided midway therein. The drain member 102 is disposed inside the chamber apparatus CH, and the discharge mechanism 103 is disposed outside of the chamber apparatus CH. A discharge passageway 105A is provided to the tank 105, and is constituted so that the liquid 1 from the drain member 102 is discharged from the discharge passageway 105A when a prescribed amount has accumulated. Furthermore, in the discharge mechanism 103, the pump 107 is driven, and the liquid 1 recovered by the drain member 102 is collected so that it is sucked into the tank 105.

For example, if it is determined that the liquid 1 has adhered to the movable mirror 55 during the exposure of the sixth shot region S6, then the control apparatus CONT stores that information related to the sixth shot region S6 after the scanning exposure thereof is complete. The information related to the sixth shot region S6 includes the position information of the substrate stage PST when that sixth shot region S6 was exposed (i.e., the position information of the sixth shot region S6). The position information of the substrate stage PST at that time can be derived based on the measurement result of the laser interferometer 56. Furthermore, after storing the information related to the sixth shot region S6, the control apparatus CONT moves the substrate stage PST so that the movable mirror 55 approaches the vicinity of the blow out nozzles 91, which is the liquid removing process position.

The control apparatus CONT moves the substrate stage PST so that the movable mirror 55 moves between the second liquid recovery mechanism 100 and the blow out nozzles 91, which is the liquid removing process position, and then drives a compressed air supply apparatus (not shown) and blows the gas, from the diagonally upward direction, against the reflecting surface 55S of the movable mirror 55 from the gas blow out ports 91A of the blow out nozzles 91. Furthermore, the control apparatus CONT drives the piezoelectric film 92 to vibrate the movable mirror 55 in parallel with the operation of blowing the gas from the blow out nozzles 91. The vibration of the movable mirror 55 promotes the removal (shaking off) of the liquid 1, and the liquid 1 adhering to the reflecting surface 55S, which the gas was blown against from the gas blow out ports 91A of the blow out nozzles 91, is removed and dropped from the reflecting surface 55S. At this time, the gas can be blown against the movable mirror 55, without missing any part, by blowing gas against the movable mirror 55 from the blow out nozzle 91 while moving them in the vertical direction and moving the substrate stage PST in the horizontal direction (the Y axial direction). Furthermore, because the blow out nozzles 91 are respectively provided on both sides of the laser interferometer 56, the gas can be blown against the movable mirror 55 without missing any part in a state wherein the range of movement of the substrate stage PST is suppressed.

Furthermore, when blowing the gas against the movable mirror 55 from the blow out nozzles 91, the blow out nozzles 91 may be provided so that they are also movable in the horizontal direction (Y axial direction), and the blow out nozzles 91 may be moved in the horizontal direction (Y axial direction) without moving the substrate stage PST in the horizontal direction (Y axial direction), and both the substrate stage PST and the blow out nozzles 91 may be moved in the horizontal direction (Y axial direction). Likewise, instead of moving the blow out nozzles 91 in the vertical direction (Z axial direction), the substrate stage PST may be moved in the vertical direction, and both the substrate state PST and the blow out nozzles 91 may be moved in the vertical direction.

The liquid 1, which is removed and dropped from the movable mirror 55, is recovered in the drain member 102 of the second liquid recovery mechanism 100 and discharged outside of the chamber apparatus CH by the discharge mechanism 103 In so doing, the liquid 1 does not accumulate in the drain member 102, and environmental fluctuations (humidity fluctuations) inside the chamber apparatus CH can thereby be prevented.

Figure 7A:
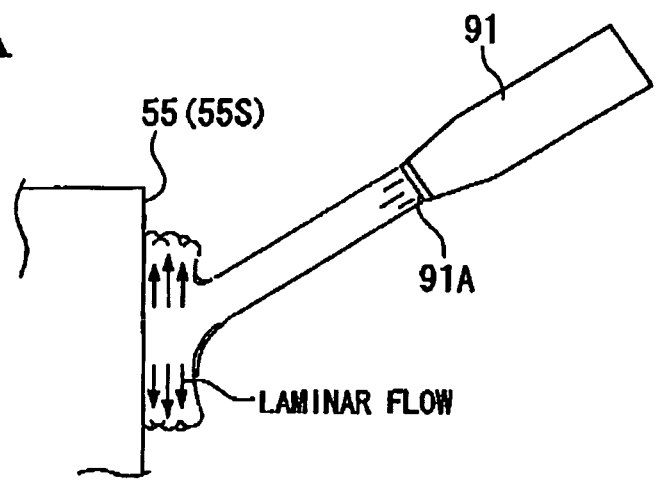
FIG. 7A and FIG. 7B are schematic drawings for explaining the operation of blowing gas.
Figure 7B:
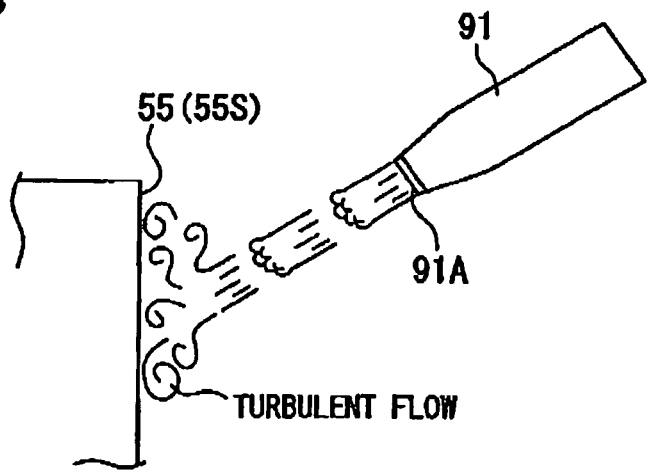

In the present embodiment, the blow out nozzles 91 can remove the liquid 1 adhering to the movable mirror 55 by blowing the gas continuously thereagainst from the diagonally upward direction, thereby ensuring that the liquid 1 does not adhere to the movable mirror 55. In addition, the gas may be blown intermittently against the movable mirror 55, as previously discussed, without blowing the gas continuously. In so doing, the liquid 1 adhering to the movable mirror 55 can be more satisfactorily removed. In other words, if the gas is blown against the movable mirror 55 continuously from the blow out nozzles 91, as in the schematic drawing depicted in FIG. 7A, then a laminar flow area of the gas tends to form on the surface of the movable mirror 55 (the reflecting surface), and there are cases wherein it is difficult to remove this liquid 1, e.g., if the droplets (water droplets) of the adhering liquid 1 are small. However, by blowing the gas against the movable mirror 55 intermittently, as in the schematic drawing depicted in FIG. 7B, a turbulent flow is formed on the surface of the movable mirror 55, and that turbulent flow area can smoothly remove the liquid 1 adhering to the movable mirror 55.

Furthermore, instead of blowing the gas against the movable mirror 55 intermittently, a turbulent flow can also be formed on the surface of the movable mirror 55 by varying the flow speed of that blown gas at a high frequency, thereby enabling the liquid 1 that adhered to the movable mirror 55 to be smoothly removed.

Furthermore, even if the gas is blown against the reference member 7 from the nozzle part 43, as explained referencing FIG. 5A and FIG. 5B, that gas can be blown intermittently or blown while varying its flow speed.

After the process of removing the liquid on the movable mirror 55 by the second liquid removing apparatuses 90 is complete, the control apparatus CONT moves the substrate stage PST, based on the information related to the sixth shot region S6 (the position information of the sixth shot region S6) that was stored earlier, in order to disposed the seventh shot region S7 at the exposure start position for performing the next scanning exposure thereof. Furthermore, after the seventh shot region S7 is disposed at the exposure start position, the control apparatus CONT starts the scanning exposure of the seventh shot region S7, and subsequently exposes each of the eighth through eleventh shot regions successively.

When the scanning exposure of each of the shot regions S1-S11 on the substrate P is complete, the control apparatus CONT stops the supply of the liquid by the liquid supply mechanism 10, and moves the subsequent stage PST so that the recovery port 33 of the stage liquid recovery apparatus 30, which is provided to the substrate stage PST, opposes the projection optical system PL. Furthermore, the control apparatus CONT recovers the liquid 1 below the projection optical system PL using the liquid recovery mechanism 20 and the stage liquid recovery apparatus 30 in combination. Thus, because the liquid 1 in the immersion area AR2 is recovered simultaneously by the liquid recovery mechanism 20, wherein the recovery port is disposed above the substrate stage PST (substrate P), and the stage liquid recovery apparatus 30, wherein the recovery port is disposed in the substrate stage PST, it is possible to reduce the liquid 1 remaining on the front of the projection optical system PL and on the substrate P.

In addition, after the exposure of the substrate P is complete, the stage liquid recovery apparatus 30 can recover the liquid 1 in the immersion area AR2, as well as the liquid 1 that flowed to the outer side of the substrate P (the auxiliary plate 57) during the immersion exposure. In addition, although the recovery port 33 of the stage liquid recovery apparatus 30 is provided in an annular (torric) shape around the substrate P, it may also be provided partially at a prescribed position in the vicinity of the substrate P (the auxiliary plate 57), taking into consideration the movement direction of the substrate stage PST after the exposure of the substrate P is complete. In addition, before and after the immersion exposure, it is acceptable if the vibrations attendant with the recovery operation are large and, consequently, the recovery power of the liquid recovery mechanism 20 may be made larger than during immersion exposure.

In addition, if the liquid 1 on the substrate P is not totally recovered after the completion of an immersion exposure, then it is acceptable, for example, to move the substrate stage PST that supports the substrate P so that it is disposed at a position spaced apart from the projection optical system PL, specifically, below the blowing apparatus 41, and then to blow the gas against the substrate P and recover the blown off liquid 1 by the stage liquid recovery apparatus 30. Of course, this operation of blowing the gas can also be performed against the auxiliary plate 57, the surface of the Z stage 52 on the outer side of the auxiliary plate 57, and the like, and not just against the substrate P. In this case as well, the residual adhered liquid 1 can be satisfactorily removed by blowing the gas intermittently (or while varying the flow speed).

In other words, although the first liquid removing apparatus 40 removes the liquid 1 remaining on the reference member 7, it is also possible to remove the liquid 1 remaining on the substrate stage PST on components other than the reference member 7. For example, in the case of a state wherein, during immersion exposure, the liquid 1 flows out or scatters to the outer side of the substrate P and is disposed on the substrate stage PST (Z stage 52), then the first liquid removing apparatus 40 can remove the liquid 1 thereon after the exposure of the substrate P is complete. In this case, the liquid 1 that is blown off by the blowing apparatus 41 of the first liquid removing apparatus 40 may be recovered by the liquid absorbing member 31 disposed in the groove part (recovery port) 33 of the stage liquid recovery apparatus 30.

In addition, the nozzle part 43 of the blowing apparatus 41 may be provided movable with respect to the substrate stage PST in advance, and the liquid 1 that flowed to the outer side of the substrate P may be recovered during or after the exposure thereof.

As explained above, a turbulent flow is formed on the surface of the movable mirror 55 by blowing the gas, either intermittently or while varying the flow speed, against the movable mirror 55 (or reference member 7) that is disposed in the vicinity of the image plane of the projection optical system PL, and it is therefore possible to satisfactorily remove the unnecessary liquid 1 adhering on the movable mirror 55. Furthermore, vibrating the movable mirror 55, in parallel with the operation of blowing the gas, promotes the removal of the liquid 1 adhering on the movable mirror 55, which enables the satisfactory removal of that liquid 1.

Furthermore, if the control apparatus CONT in the present embodiment has determined, based on the measurement result of the laser interferometer 56, that the liquid 1 scattered from the substrate P has adhered to the movable mirror 55, then, without waiting for the completion of the exposure of all shot regions S1-S11 on one substrate P, the liquid removing process is performed immediately in the middle of those exposures (in the time period after the exposure of the sixth shot region S6 until the start of the exposure of the seventh shot region S7). Meanwhile, even if the liquid 1 adheres to the movable mirror 55, and the amount of reflected light therefrom that is received by the laser interferometer 56 decreases, it is possible to measure the position of the substrate stage PST if the amount of light received is maintained at greater than or equal to a prescribed value (greater than or equal to a threshold value), which is predetermined by, for example, the performance of the laser interferometer 56. Consequently, even if, for example, the liquid 1 adheres to the movable mirror 55 during the exposure of one substrate P, the control apparatus CONT may perform the liquid removing process by the second liquid removing apparatus 90 after completing the exposure of all of the short regions S1-S11 on that one substrate P. In other words, when sequentially exposing a plurality of substrates P, the control apparatus CONT may remove the liquid 1 adhering to the movable mirror 55 by using the second liquid removing apparatus 90 during the time period after the completion of the exposure of the eleventh shot region S11 on one substrate (first substrate) P until the start of the exposure of the first shot region S1 on the next substrate (second substrate) P.

In addition, in the abovementioned embodiment, the control apparatus CONT assesses whether the liquid 1 is adhering to the movable mirror 55 based on the measurement relief of the laser interferometer 56 (the light receiving result), and then determines the timing by which to perform the liquid removing process based on the result of that assessment. On the other hand, if only a slight amount of the liquid 1 is adhering to the movable mirror 55 as discussed above, then it is possible to measure the position of the substrate stage PST. Accordingly, the control apparatus CONT may perform the process of removing the liquid by the second liquid removing apparatus 90 periodically at a predetermined prescribed time interval (or at intervals of a prescribed number of processed substrates) without relying on the measurement result of the laser interferometer 56.

Figure 8:
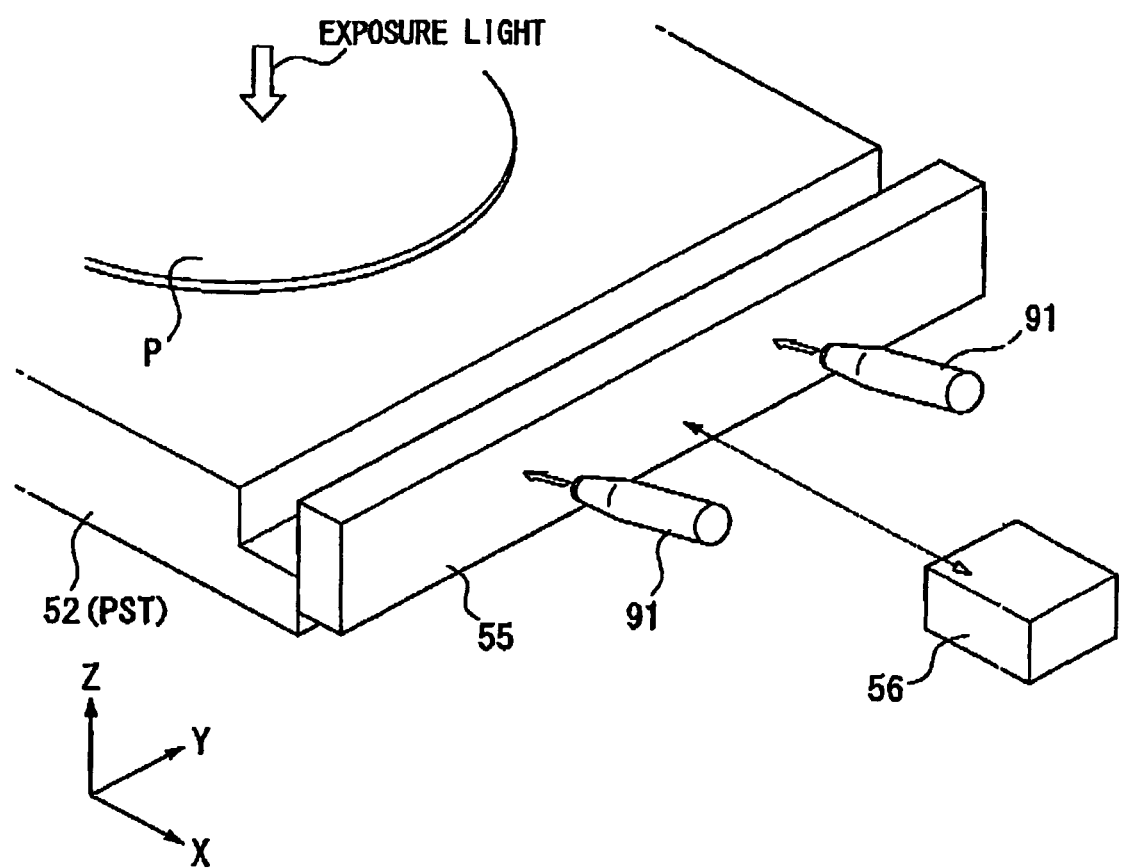
FIG. 8 is a schematic view showing one example of the operation of the second liquid removing apparatus, which is a liquid removing mechanism.

As discussed above, the liquid removing operation for removing the liquid 1 that adheres to the movable mirror 55 can be performed during the exposure operation of one substrate P. Here, the liquid removing operation in the abovementioned embodiment is performed between the exposure of the sixth shot region S6 and the exposure of the seventh shot region S7, and the exposure operation is temporarily interrupted during that liquid removing operation. However, as depicted in FIG. 8, a constitution is also possible wherein the liquid 1 is removed by the blow out nozzles 91 (and the second liquid recovery mechanism 100) accessing (approaching in the X axial direction) the movable mirror 55 of the substrate stage PST, and blowing the gas against that movable mirror 55 while continuing the exposure operation of that substrate P (in parallel with the exposure operation of the substrate P). At that time, the blown out nozzles 91 are provided on both sides of the laser interferometer 56, and can consequently access the movable mirror 55 and blow the gas thereagainst, while moving synchronized to that movable mirror 55 in the X axial direction, without interfering with the optical path of the measurement beam of the laser interferometer 56. Furthermore, it is preferable to set the flow speed of the blown gas, and the like, to an optimal value that does not reduce the position measurement accuracy, without driving the vibrating apparatus, so that the position measurement accuracy of the laser interferometer 56 is not reduced by the vibration of the movable mirror 55 due to the liquid removing operation. In addition, if the exposure operation and the liquid removing operation are performed in parallel, then the liquid removing operation may be, in addition to blowing the gas, the operations of suctioning the liquid or supplying the dry gas.

Furthermore, when the liquid 1 has adhered to the movable mirror 55, the control apparatus CONT can also blow the gas against the entire area of the surface (the reflecting surface) of the movable mirror 55 from the blow out nozzles 91, and can also blow the gas against part of the area where the liquid 1 is adhered. If the liquid 1 adheres to part of the area of the movable mirror 55, then the amount of the reflected light received will decrease only when the measurement beam is irradiated upon that partial area, and therefore the control apparatus CONT can derive the area of the movable mirror 55 where the liquid 1 is adhered based on the amount of the reflected light of the measurement beam, which is irradiated by the laser interferometer 56, that is received from the movable mirror 55. Accordingly, gas may be blown against only the partial area of the movable mirror 55. In so doing, it is possible to reduce the work time for blowing the gas. Thus, based on the measurement result of the laser interferometer 56, the control apparatus CONT can determine the timing at which the liquid removing process is performed by the second liquid removing apparatus 90, and can also determine the area at which the second liquid removing apparatus 90 performs the liquid removing process.

Furthermore, to remove the liquid 1 adhering to the movable mirror 55 in the abovementioned embodiment, the vibration operation by the piezoelectric film 92 is performed in parallel with the operation of blowing the gas from the gas blow out ports 91A; however, the liquid 1 adhering to the movable mirror 55 can be removed by performing only the vibration operation or the gas blowing operation. In particular, because the reflecting surface 55S of the movable mirror 55 is provided perpendicular (or substantially perpendicular) to the horizontal plane, it is possible to satisfactorily remove the liquid 1 by the self weight (self weight action) of the liquid 1 by performing either the vibration operation or the gas blowing operation.

Furthermore, there is a possibility that error will arise, for example, in the orthogonality with respect to the reference coordinate system within the XY plane if, for example, the movable mirror 55 becomes mispositioned when vibrated, and the substrate stage PST is then moved based on the position measurement result, which is based on the measurement beam that was irradiated upon that mispositioned movable mirror 55. Consequently, it is preferable to periodically perform a calibration process that compensates the substrate stage position measurement error, including orthogonality error.

To perform the liquid removing process after the exposure of the sixth shot region S6 in the abovementioned embodiment, the control apparatus CONT moves the substrate stage PST so that the movable mirror 55 accesses the vicinity of the blow out nozzles 91 (the liquid removing process position). However, the present invention is not limited thereto, and it is also possible to provide a movement mechanism to the blow out nozzles and the drain member 102 (second liquid recovery mechanism 100) so that they can access the movable mirror 55 without moving the substrate stage PST after exposing the sixth shot region S6. Alternatively, the drain member 102, along with the substrate stage PST and the blow out nozzles 91, may be moved.

Figure 9:
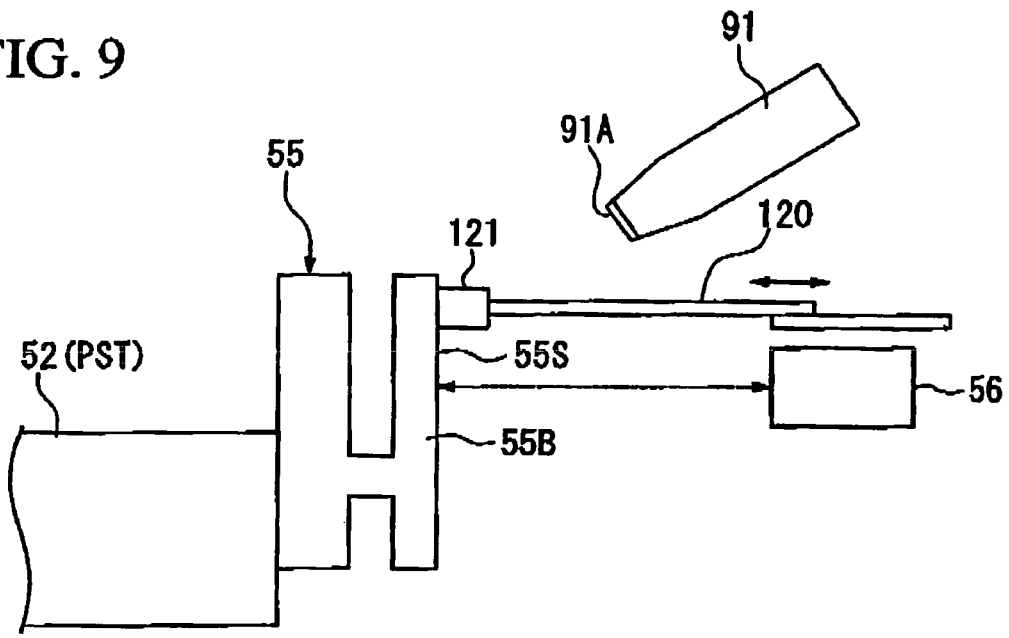
FIG. 9 shows another embodiment of a vibrating apparatus.

In the abovementioned embodiment, the vibrating apparatus 92, which vibrates the movable mirror 55, is made of a piezoelectric film that is attached (affixed) to the movable mirror 55, but a constitution is also possible wherein it is not attached thereto. For example, as depicted in FIG. 9, a vibrating apparatus 121, such as a piezoelectric device, is attached to the front part of an arm mechanism 120, which is driven to bring the piezoelectric device 121 affixed to the front part of the arm mechanism 120 into contact with the movable mirror 55; further, when vibrating the movable mirror 55 in order to remove the liquid 1, the movable mirror 55 can be vibrated by applying a voltage to the piezoelectric device 121 to drive it in a state wherein the movable mirror 55 is made to contact the piezoelectric device 121. After the liquid removing operation is complete, the piezoelectric device 121 is withdrawn by the arm mechanism 120. Furthermore, a constitution is also possible wherein the arm mechanism 120 and the piezoelectric device 121 attached to the front part thereof are disposed on both sides of the laser interferometer 56.

In the abovementioned embodiment, a vibrating apparatus (a piezoelectric device) is attached to every component, such as the movable mirror 55 and the reference member 7, and vibrated, but the entire substrate stage PST, which supports all of these components, may be vibrated by a vibrating apparatus during the liquid removing process, or may be jogged (vibrated) by driving the substrate stage drive apparatus PSTD. In so doing, it is possible to promote the removal of the liquid 1 adhering on the auxiliary plate 57 and the like—not just to the movable mirror 55, the reference member 7, and the like.

Figure 10:
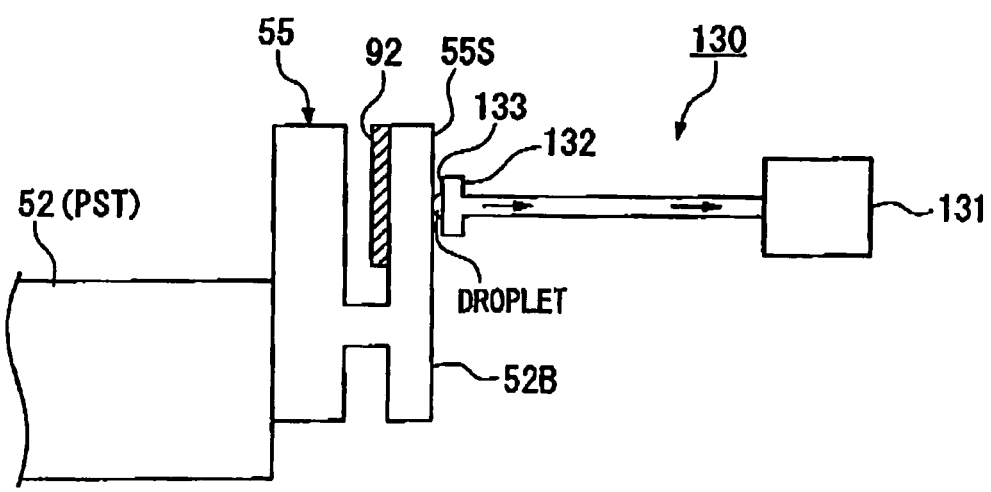
FIG. 10 is a schematic view showing another example of the second liquid removing apparatus, which is a liquid removing mechanism.

In the abovementioned embodiment, the liquid adhering to the movable mirror 55 is removed by blowing the gas thereagainst, but it is also possible to remove the liquid 1 adhering to the movable mirror 55 by using a suction apparatus 130, as depicted in FIG. 10. In FIG. 10, the suction apparatus 130 includes a suction part 131, which includes a tank and a pump, and a suction nozzle 132, which is connected to the suction part 131. Furthermore, a suction port 133 of the suction nozzle 132 is disposed proximate to the movable mirror 55. When removing the liquid 1 adhering to the movable mirror 55, the control apparatus CONT drives the suction part 131 to suck and recover the liquid 1 on the movable mirror 55 through the suction nozzle 132. Furthermore, if using the suction apparatus 130 to recover the liquid 1, the vibration operation may be performed in parallel by the vibrating apparatus 92, and it is also acceptable to perform only the suction operation by the suction apparatus 130.

Figure 11:
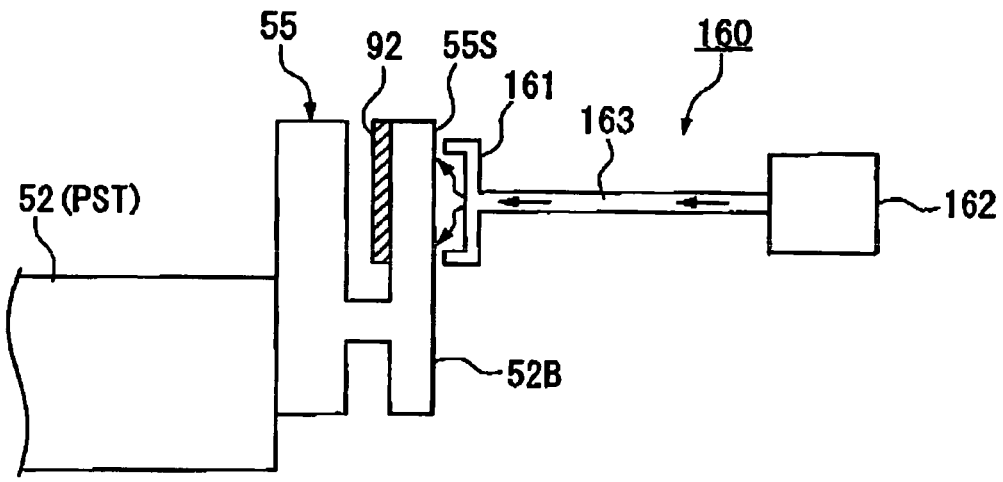
FIG. 11 is a schematic view showing another example of a second liquid removing apparatus, which is a liquid removing mechanism.

Alternatively, it is also possible to remove the liquid 1 adhering to the movable mirror 55 using a drying apparatus 160, as depicted in FIG. 11. In FIG. 11, the drying apparatus 160 includes a cover member 161, which covers the movable mirror 55, and a dry gas supply part 162, which supplies dry gas to the space inside the cover member 161. The dry gas supply part 162 supplies dry gas to the space inside the cover member 161, which covers the movable mirror 55, through a conduit 163. This promotes the vaporization of the liquid 1 adhering to the movable mirror 55, which removes the liquid 1.

Furthermore, in the abovementioned embodiment, the vibrating apparatus was explained using a piezoelectric device, such as piezoelectric actuator, as an example, but it is also possible to use other actuators that use Lorentz's force, such as a voice coil motor, as the vibrating apparatus.

Figure 12:
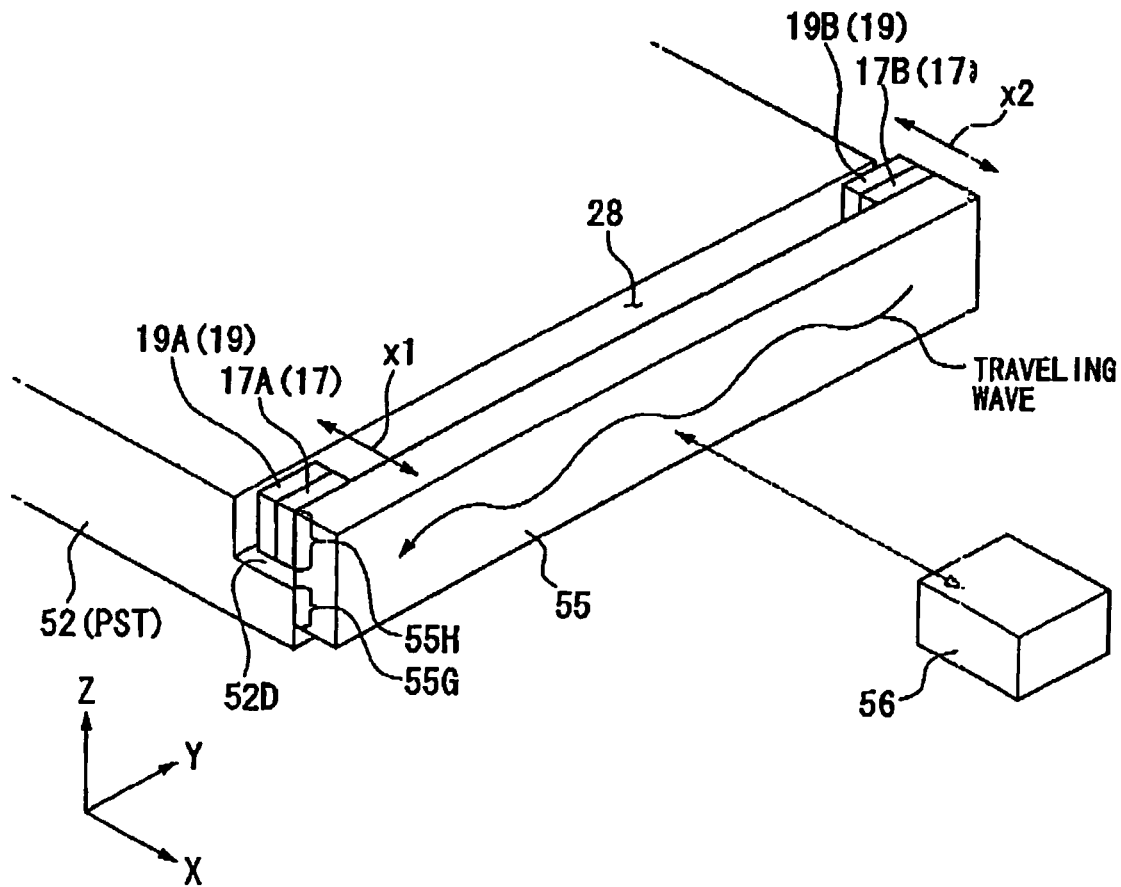
FIG. 12 shows another embodiment of the vibrating apparatus.

FIG. 12 is a schematic oblique view that depicts another embodiment of the vibrating apparatus that vibrates the movable mirror 55. In the present embodiment, the movable mirror 55 does not have a groove part and is attached to the end part of the Z stage 52. In FIG. 12, a step part 52D, which is L shaped when viewed in a side view, is formed at the end part of the Z stage 52 on the +X side, and extends in the Y axial direction. Furthermore, a lower part area 55G, which is on the surface of the movable mirror 55 that opposes the Z stage 52, is connected to the Z stage 52, and a spacer 28 is formed between an upper part area 55H and the Z stage 52. Namely, the upper part of the movable mirror 55, the lower part of which is connected to the Z stage 52, constitutes a free end of the vibration.

Piezoelectric devices 17 (17A, 17B), which serve as vibrating apparatuses, are attached at a plurality of prescribed positions of the upper part area 55H, which is on the surface of the movable mirror 55 that opposes the Z stage 52. Furthermore, other actuators, such as voice coil motors, may be used as the vibrating apparatuses. In the present embodiment, the piezoelectric devices 17A, 17B are respectively attached to both end parts of the upper part area 55H of the movable mirror 55 in the longitudinal direction. Furthermore, weight members 19A, 19B are connected to these piezoelectric devices 17A, 17B respectively. At this point, the piezoelectric devices 17, which are affixed to the movable mirror 55, and the weight members 19 are spaced apart from the Z stage 52. The piezoelectric devices 17A, 17B vibrate the movable mirror 55 by expanding and contracting in the direction depicted by the arrows x1, x2 in the figure. At this point, the weight members 19A, 19B are connected to the piezoelectric devices 17A, 17B, which amplifies the vibration force (momentum).

In the present embodiment, the control apparatus CONT generates a traveling wave in the movable mirror 55 by vibrating such at a plurality of (two) positions using the two piezoelectric devices 17A, 17B, respectively. Specifically, a traveling wave is generated in the movable mirror 55 by generating high frequencies, out of phase and at the same wavelength, at each of the positions where the two piezoelectric devices 17A, 17B are attached.

For example, it is possible to express the standing wave $U_0$ generated at a given single point on the movable mirror 55 by the sum of the traveling wave and the reverse wave.

-EQUATION 1- (1)

$$U_0 = A_0 \sin 2\pi(x/\lambda - t/T) + A_0 \sin 2\pi(x/\lambda + t/T)$$
$$= 2A_0 \sin 2\pi x/\lambda \cdot \cos 2\pi t/T$$

where:
$A_0$: Amplitude
$\lambda$: Wavelength
T: Period
x: Arbitrary point
t: Arbitrary time The traveling wave U is generated by adding two of the standing waves in equation (1) and shifting the phase of one of them.

-EQUATION 2- (2)

$$U = A\sin 2\pi x/\lambda \cdot \cos 2\pi t/\lambda + A\sin 2\pi(x+\alpha)/\lambda \cdot \cos 2\pi(2\pi t/T + \beta)$$
$$= A\sin 2\pi(x/\lambda - t/T)$$

where:
A: Amplitude
α: Positional offset
β: Phase offset

The control apparatus CONT generates the traveling wave in the movable mirror 55 by using each of the two piezoelectric devices 17A, 17B to vibrate the movable mirror 55 so that the above equation (2) is satisfied. In so doing, it is possible to satisfactorily remove the liquid 1 adhering to the movable mirror 55.

The following explains another embodiment of the liquid removing apparatus. In the following explanation, constituent parts that are identical or equivalent to those in the embodiment discussed above are assigned the identical symbol, and the explanation thereof is simplified or omitted.

Figure 13:
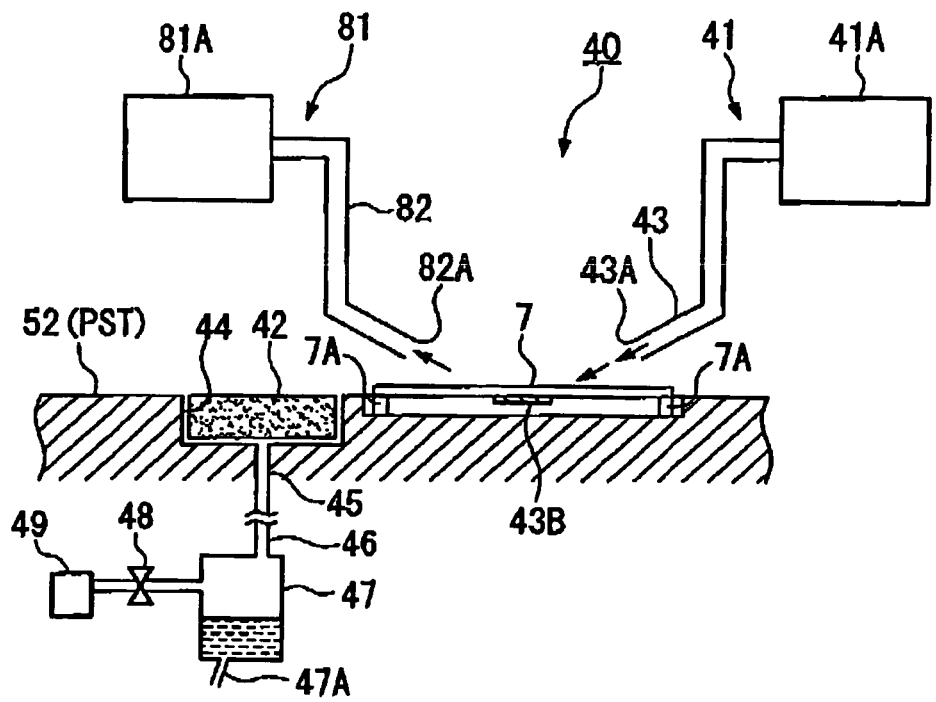
FIG. 13 is a schematic view showing another example of the first liquid removing apparatus, which is a liquid removing mechanism.

FIG. 13 depicts another embodiment of the first liquid removing apparatus 40. In FIG. 13, the first liquid removing apparatus 40 includes a suction apparatus 81, which sucks the liquid 1 adhering on the reference member 7. The suction apparatus 81 includes a suction part 81A, which includes a tank and a pump, and a suction nozzle 82 connected to the suction part 81A. Furthermore, a suction port 82A of the suction nozzle 82 is disposed proximate to the reference member 7. When removing the liquid 1 remaining on the reference member 7, the blowing apparatus 41 blows gas thereagainst, and the suction apparatus 81 sucks the liquid 1 on the reference member 7.

Furthermore, in the example explained referencing FIG. 13, the blowing apparatus 41 and the suction apparatus 81 were provided in combination to the first liquid removing apparatus 40, but a constitution is also acceptable wherein just the suction apparatus 81 is provided. The suction apparatus 81 sucks, by the suction port 82A, the liquid 1 remaining on the reference member 7, and this liquid 1 can thereby be removed (recovered). In addition, it is possible, of course, to perform the vibration operation by the piezoelectric device 43B in parallel with the suction operation by the suction apparatus 81. Furthermore, the nozzle part 82 of the suction apparatus 81 may be provided movable with respect to the substrate stage PST, and the liquid 1 that flows to the outer side of the substrate P may be recovered during or after the exposure thereof.

Figure 14:
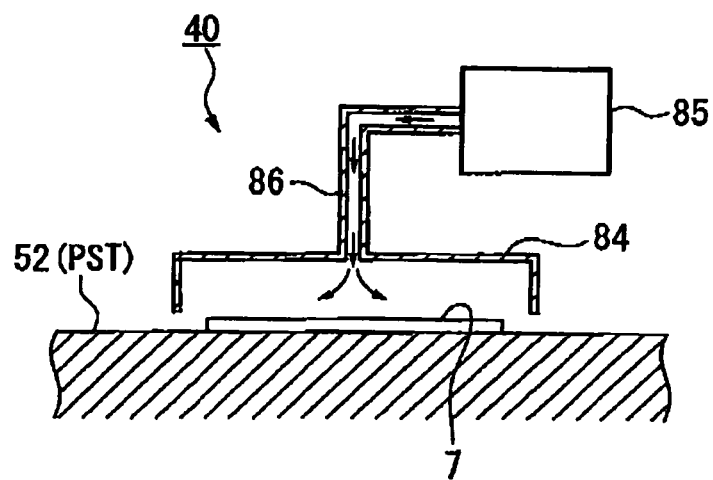
FIG. 14 is a schematic view showing another example of the first liquid removing apparatus, which is a liquid removing mechanism.

FIG. 14 is a cross sectional view that depicts another embodiment of the first liquid removing apparatus 40. As depicted in FIG. 14, the first liquid removing apparatus 40 includes a cover member 84, which covers the reference member 7, and a dry gas supply part 85, which supplies dry gas to the space inside the cover member 84. The dry gas supply part 85 supplies dry gas to the space inside the cover member 84, wherein the reference member 7 is disposed, through a conduit 86. This promotes the vaporization of the liquid 1 remaining on the reference member 7, which removes the liquid 1.

Figure 15:
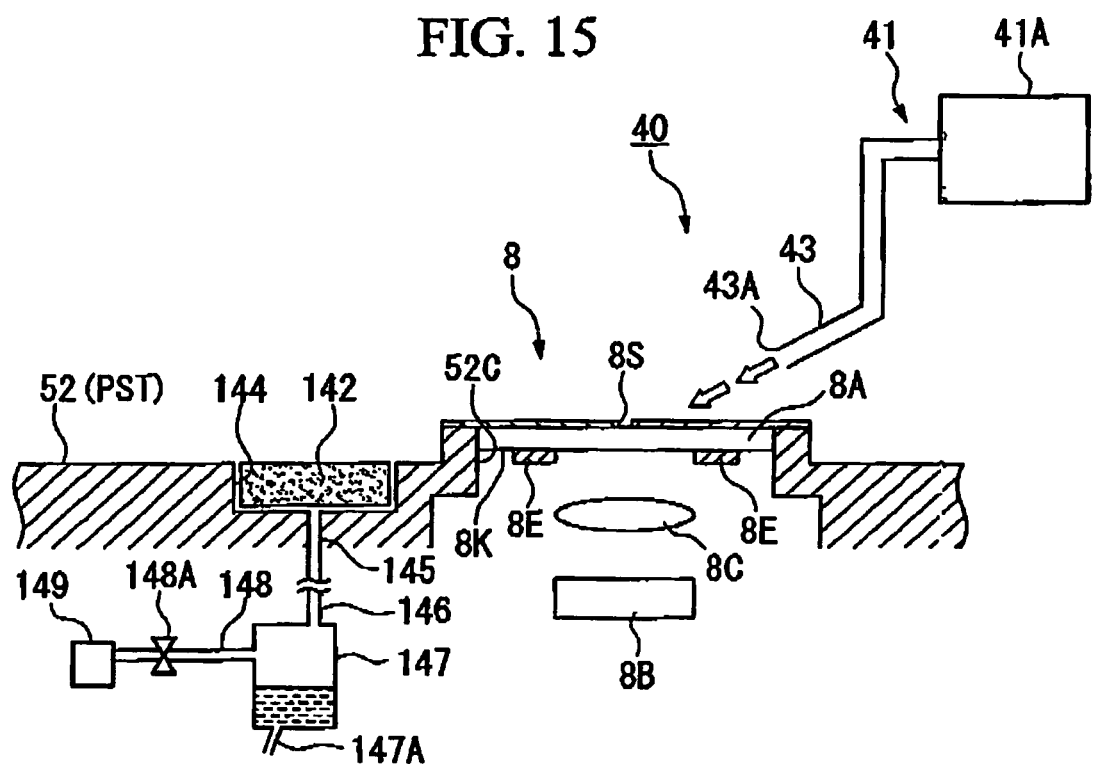
FIG. 15 is a schematic view showing another example of the first liquid removing apparatus, which is a liquid removing mechanism.

FIG. 15 depicts an aspect of the light receiving devices 8 wherein the liquid 1 adhering to light transmitting member 8A, which is provided on the substrate stage PST, is removed. In the present embodiment, the light receiving device 8 is a sensor (AIS sensor) that measures the imaging characteristics adjustment information in order to compensates for changes in the imaging characteristics of the projection optical system PL by receiving the light (exposure light) irradiated through the projection optical system PL to the image plane side (substrate P side) thereof, and measuring the aerial image of a measurement mark through the projection optical system PL. The light receiving device 8 includes: the light transmitting member 8A, which is provided on the substrate stage PST (Z stage 52), that patterns a light shielding film on the surface of the glass plate, and wherein the slit part 8S, which is a light transmitting part, is formed as the center part; a condenser optical system 8C, which is embedded in the Z stage 52 and whereupon the light that passed through the slit part 8S of the light transmitting member 8A is irradiated; and a light receiving element 8B that receives the light that passed through the condenser optical system 8C. Furthermore, a relay optical system is provided, for example, between the condenser optical system 8C and the light receiving element 8B, and the light receiving element 8B can also be disposed on the outer side of the Z stage 52.

When measuring the serial image by the light receiving device 8, it is conceivable to perform an operation wherein the liquid 1 is filled between the projection optical system PL and the light transmitting member 8A of the light receiving device 8 in a state wherein the projection optical system PL and the light transmitting member 8A are mutually opposed, and the light (exposure light) is irradiated upon the light receiving device 8 through the projection optical system PL and the liquid 1. After the measurement of the aerial image through the liquid 1 is complete, the control apparatus CONT moves the substrate stage PST to dispose the light transmitting member 8A (light receiving device 8) below the nozzle part 43 of the first liquid removing apparatus 40. The light transmitting member 8A is supported in an aperture part 52C, which is formed in the Z stage 52, and a vibrating apparatus 8E is provided at a prescribed position outside of the slit part 8S on a lower surface 8K of the light transmitting member 8A. The vibrating apparatus 8E includes a piezoelectric device, and the control apparatus CONT vibrates the light transmitting member 8A using this piezoelectric device 8E by applying a prescribed voltage thereto.

The liquid absorbing member 142, which recovers the liquid 1 that was removed from the light transmitting member 8A by the first liquid removing apparatus 40 is provided on the Z stage 52 at a position adjacent to the light transmitting member 8A. The light absorbing member 142 is provided at a position opposing the gas blow out port 43A of the nozzle part 43 so that the light transmitting member 8A is interposed therebetween. The liquid absorbing member 142 is disposed in a groove part 144, which is a recovery port provided in the Z stage 52. Like the liquid absorbing member 31 of the stage liquid recovery apparatus 30, the liquid absorbing member 142 is made of a porous material, e.g., porous ceramics, sponge, or the like, and can hold a prescribed amount of the liquid 1.

The control apparatus CONT blows off and removes the liquid 1 remaining on and adhering to the light transmitting member 8A by blowing gas thereagainst via the nozzle part 43 of the first liquid removing apparatus 40. The blown off liquid 1 is held (recovered) by the liquid absorbing member 142, which is disposed at a position opposing the gas blow out port 43A of the nozzle part 43.

Furthermore, while using the piezoelectric device 8E to vibrate the light transmitting member 8A, the gas from the gas blow out port 43A of the nozzle part 43 is blown against that light transmitting member 8A. The vibration of the light transmitting member 8A promotes the removal (shaking off) of the liquid 1, enabling it to be satisfactorily removed from the light transmitting member 8A by the blowing of the gas. In addition, even in this case, the gas may be intermittently blown against the light transmitting member 8A.

A passageway 145, which is continuous with the groove part 144, is formed inside the Z stage 52, and the bottom part of the liquid absorbing member 142, which is disposed in the groove part 144, is connected to the passageway 145. The passageway 145, which is connected to the groove part 144 wherein the liquid absorbing member 142 is disposed, is connected to one end of a conduit 146, which is provided external to the Z stage 52. On the other hand, the other end of the conduit 146 is connected to a pump 149, which is a suction apparatus, through a conduit 148 that has a tank 147, which is provided external to the Z stage 52, and a valve 148A. A discharge passageway 147A is provided to the tank 147, and the liquid 1 is discharged from the discharge passageway 147A when a prescribed amount has accumulated. Furthermore, the control apparatus CONT drives the gas supply part 41A of the first liquid removing apparatus 40 and drives the pump 149, which collects the liquid 1 that was recovered by the liquid absorbing member 142 so that it is sucked into the tank 147.

Furthermore, the light receiving device 8a was explained by using as an example a space image measuring sensor for measuring the imaging characteristics adjustment information of the projection optical system PL, but, for example, an illumination intensity sensor that detects the illumination intensity of the exposure light EL irradiated to the image plane side of the projection optical system PL, or an illumination intensity uniformity sensor for measuring the illumination intensity distribution of the projection area AR1, may also be used as the light receiving device 8.

Figure 16:
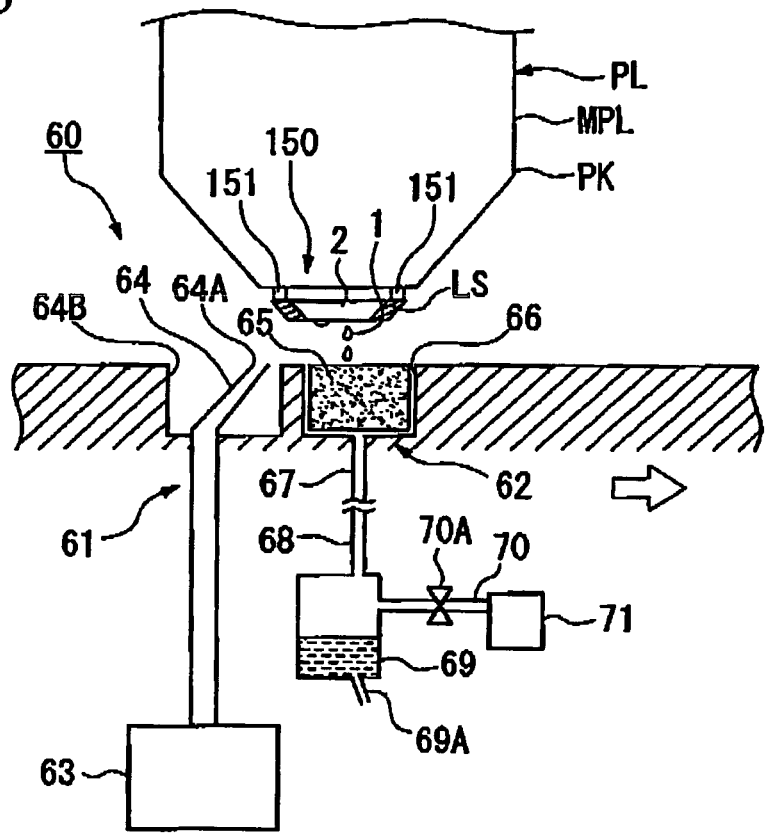
FIG. 16 is a schematic view showing one example of a third liquid removing apparatus, which is a liquid removing mechanism.

The following explains the third liquid removing apparatus 60, which removes the liquid 1 remaining on the optical element 2 at the front part of the projection optical system PL, the lens cell LS that holds the optical element 2, and the like, referencing FIG. 16. In FIG. 16, the third liquid removing apparatus 60 includes a blowing apparatus 61 that blows gas against the optical element 2, which constitutes the front component of the projection optical system PL, the lens cell LS that holds the optical element 2, and the like. A recovery apparatus 62 recovers the liquid remaining at the front of the projection optical system PL and that is blown off and drops due to the blowing of the gas by the blowing apparatus 61. The blowing apparatus 61 includes a gas supply part 63 and a nozzle part 64, which is connected to the gas supply part 63 and provided to a recessed part 64B of the Z stage 52, and the gas blow out port 64A of the nozzle part 64 can be disposed in the vicinity of the front of the projection optical system PL facing upward. Meanwhile, the recovery apparatus 62 includes: the recovery port (groove part) 66, which is provided to the Z stage 52; the liquid absorbing material 65, which is disposed in the recovery port 66 and is made of a porous material; a passageway 67, which is formed inside the Z stage 52 and is continuous with the groove part 66; a conduit 68, which is provided external to the Z stage 52 and one end of which is connected to the passageway 67; a tank 69, which is connected to the other end of the conduit 68 and is provided external to the Z stage 52; and a pump 71, which is a suction apparatus, connected to this tank 69 through a conduit 70 that has a valve 70A. A discharge passageway 69A is provided to the tank 69, and the liquid 1 is discharged from the discharge passageway 69A when a prescribed amount has accumulated. Furthermore, in the recovery apparatus 62, the pump 71 is driven and collects the liquid 1 that was recovered by the liquid absorbing material 65 so that it is sucked into the tank 69.

In the present embodiment, the gas blow out port 64A of the nozzle part 64 of the blowing apparatus 61 is a slit shape, wherein its longitudinal direction is set to the Y axial direction (refer to FIG. 3), and the recovery port 65 of the recovery apparatus 62 is rectangularly formed, wherein its longitudinal direction is set to the Y axial direction, at a position adjacent to the gas blow out port 64A on the +X side. Furthermore, after the exposure of the substrate P is complete, the third liquid removing apparatus 60 removes the liquid 1 remaining not only on the front of the projection optical system PL, which contacts the liquid 1 in the immersion area AR2 during the exposure of the substrate P, but also the liquid 1 remaining on the supply nozzles 13 of the liquid supply mechanism 10 and the recovery nozzles 23 of the liquid recovery mechanism 20.

After the immersion exposure of the substrate P is complete, the control apparatus CONT recovers the liquid 1 on the substrate P using the liquid recovery mechanism 20. Furthermore, after the recovery of the liquid 1 on the substrate P by the liquid recovery mechanism 20 is complete, the control apparatus CONT moves the substrate stage PST so that the third liquid removing apparatus 60 is disposed below the projection optical system PL. Furthermore, the third liquid removing apparatus 60 blows gas, from the diagonal direction, from the nozzle part 64 of the blowing apparatus 61 against the front of the projection optical system PL, and thereby blows off and removes the liquid 1 remaining thereon. At this time, the liquid 1 can be more satisfactorily removed by blowing the gas intermittently.

The blown off liquid 1 falls and is recovered in the recovery port 66, wherein the liquid absorbing material 65 of the recovery apparatus 62 is disposed. At this point, the control apparatus CONT drives the third liquid removing apparatus 60 while moving the substrate stage PST, for example, in the X axial direction orthogonal to the longitudinal direction (Y axial direction) of the gas blow out port 64A and the recovery port 65. In so doing, the gas is blown against the front of the projection optical system PL and, of course, the supply nozzles 13 of the liquid supply mechanism 10 and the recovery nozzles 23 of the liquid recovery mechanism 20 disposed at the circumference of the front of the projection optical system PL, and the liquid 1 remaining on these supply nozzles 13 and recovery nozzles 23 can thereby be removed.

In addition, the gas may also be blown against the optical element 2 at the front part of the projection optical system PL while vibrating such. The optical element 2 is held by the lens cell LS, and the lens cell LS and the lens barrel PK of the projection optical system main body MPL are coupled by a plurality (for example, six) link parts 151, which have actuators (vibrating apparatuses), such as voice coil motors and piezoelectric devices. The control apparatus CONT can vibrate the lens cell LS and the optical element 2 held thereby by driving the abovementioned actuators, which are built into the link parts 151. Furthermore, by constituting a parallel link mechanism by the provision of a plurality of link parts 151, each having a built-in actuator, it is possible to absorb/remove the vibrations that transmit to the optical element 2 through the liquid 1 during the immersion exposure of the substrate P by driving the abovementioned parallel link mechanism.

As explained above, by removing the liquid 1 remaining on the front of the projection optical system PL, which contacts the liquid 1 in the immersion area AR2 during exposure, on the supply nozzles 13, and on the recovery nozzles 23, it is possible to suppress problems, such as the liquid 1, which remains on the front of the projection optical system PL and the like, falling and causing environmental changes that adversely impact the peripheral apparatuses, even if, for example, the substrate stage PST moves from below the projection optical system PL (the exposure process position) to the position where the substrate P is loaded and unloaded (the substrate exchange position). In particular, it is possible to suppress the occurrence of adhered residue (water mark) by ensuring that the liquid 1 does not remain on the optical element 2 at the front of the projection optical system PL.

Furthermore, by providing the third liquid removing apparatus 60 to the substrate stage PST, it is possible, if the third liquid removing apparatus 60 is driven while moving the substrate stage PST, to blow gas against the projection optical system PL, the supply nozzles, and the recovery nozzles while scanning the third liquid removing apparatus 60 without providing a new actuator. In addition, the liquid removing operation (gas blowing operation) and the stage movement operation can be performed simultaneously, which can improve time efficiency, by performing the operation of blowing the gas by the third liquid removing apparatus 60 while moving the substrate stage PST from the exposure process position to the substrate exchange position after the immersion exposure is complete. The third liquid removing apparatus 60 can be provided in advance at a position at which it passes below the projection optical system PL while the substrate stage PST moves from the exposure process position to the substrate exchange position.

Furthermore, it is also possible to attach a vibrating apparatus, such as a piezoelectric device, to each of the supply nozzles 13 and recovery nozzles 23, and to vibrate such to remove the liquid.

Figure 17:
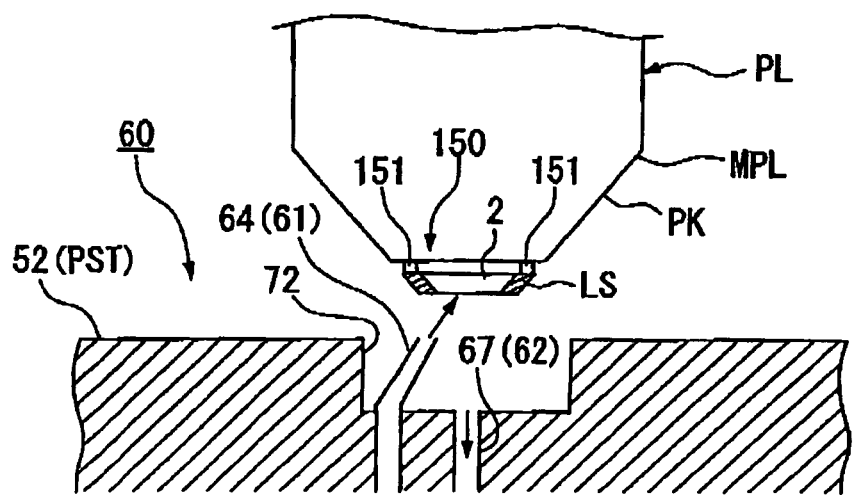
FIG. 17 is a schematic view showing another example of the third liquid removing apparatus, which is a liquid removing mechanism.

FIG. 17 and FIG. 18 are modified examples of the third liquid removing apparatus 60. As depicted in FIG. 17, a large groove part 72 may be formed in the Z stage 52, and the nozzle part 64 of the blowing apparatus 61 and the passageway (recovery port) 67 of the recovery apparatus 62 may be disposed in the groove part 72. Furthermore, in the example depicted in FIG. 17, the liquid absorbing material 65 is not provided. Thus, a constitution is also possible wherein the liquid absorbing material 65 is not provided. In addition, as depicted in FIG. 18, a plurality of nozzle parts 64 of the blowing apparatus 61 (two in the example depicted in FIG. 18) may be provided inside the groove part 72. As in the examples depicted in FIG. 17 and FIG. 18, by providing a groove part 72 larger than the front of the projection optical system PL and disposing the nozzle parts 64 and the recovery port 67 therein, the groove part 72 can suppress the scattering of the liquid 1, which was blown by the gas, to the periphery. Furthermore, even in this case, the control apparatus CONT can satisfactorily remove the liquid 1 by intermittently blowing the gas.

Alternatively, as depicted in FIG. 19, a cover member 73 can also be provided around the gas blow out port 64A of the nozzle part 64 and the recovery port 66 in order to prevent the scattering of the liquid 1, which was blown by the gas, to the surrounding area. The cover member 73 depicted in FIG. 19 is formed in a U shape in a plan view, can dispose within it the front of the projection optical system PL, and is constituted so that the front of the projection optical system PL can go into and out of the cover member 73 from the open side of the U shape. Furthermore, by aligning the longitudinal direction of the cover member 73 with the movement direction (X axial direction) of the substrate stage PST, and by providing the gas blow out port 64A and the recovery port 66 so that their longitudinal direction is set to the Y axial direction inside the cover member 73, it is possible to efficiently remove the liquid, while preventing the scattering thereof, in one scanning motion.

Furthermore, it is also possible to recover the liquid 1 that flowed to the outer side of the substrate P during the exposure thereof through the recovery port 65 of the recovery apparatus 62 of the third liquid removing apparatus 60. At this time, it is preferable to provide, in advance, a plurality of recovery ports 65 of the recovery apparatus 62 at prescribed intervals around the substrate P.

Figure 20:
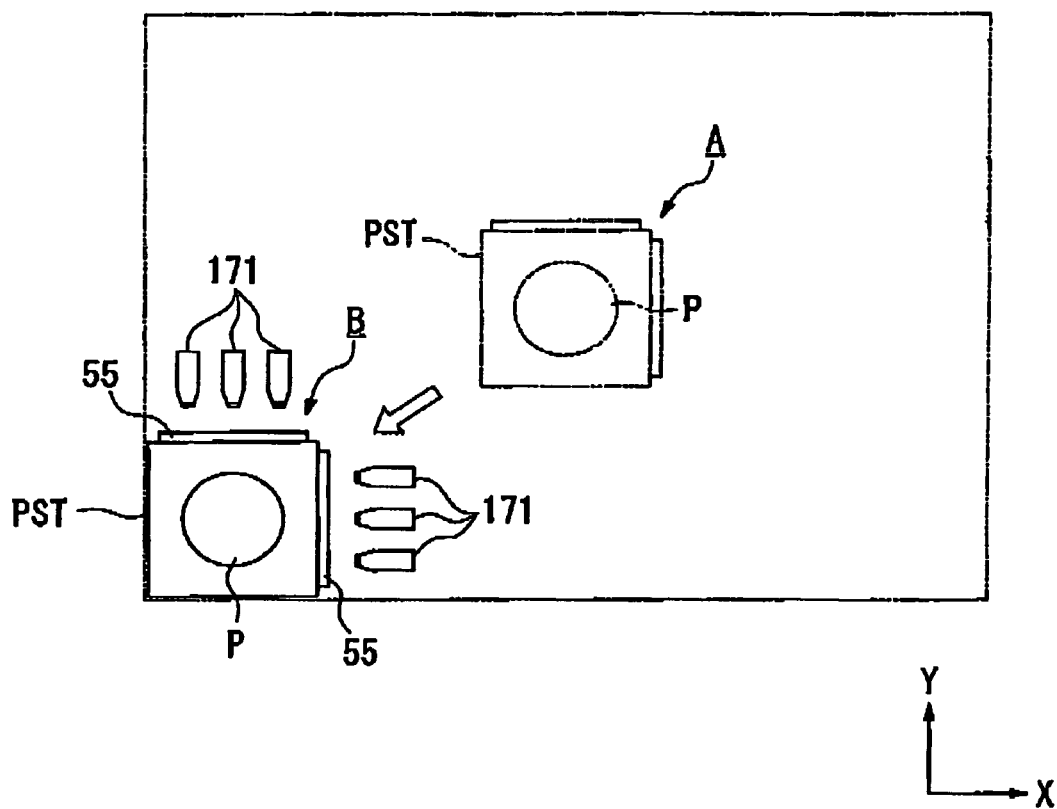
FIG. 20 is a schematic view showing another example of the second liquid removing apparatus, which is a liquid removing mechanism.

FIG. 20 is a schematic drawing that depicts blow out nozzles that constitute the liquid removing mechanism, which is provided at the substrate exchange position (load and unload position). In FIG. 20, the substrate stage PST moves between an exposure process position A and a substrate exchange position B. After the process of exposing the substrate P at the exposure process position A is complete, the control apparatus CONT moves the substrate stage PST, which holds the substrate P that was exposure processed, to the substrate exchange position B. Then, the control apparatus CONT intermittently blows the gas from the blow out nozzles 171 against the movable mirrors 55 of the substrate stage PST, which has moved to the substrate exchange position B. In so doing, the liquid 1, which scattered from the substrate P during the exposure and adhered to the movable mirrors 55, can be removed at the substrate exchange position B. Furthermore, a liquid recovery mechanism that has a drain member, as explained referencing FIG. 6, is also provided at the substrate exchange position B, and the liquid 1 removed from each movable mirror 55 is recovered by the liquid recovery mechanism. Furthermore, after (or before) the work of removing the liquid 1 adhering to each movable mirror 55, a substrate transport apparatus (not shown) unloads the substrate P, for which the exposure process was completed, from the substrate stage PST and loads an unexposed substrate P thereon.

Figure 21:
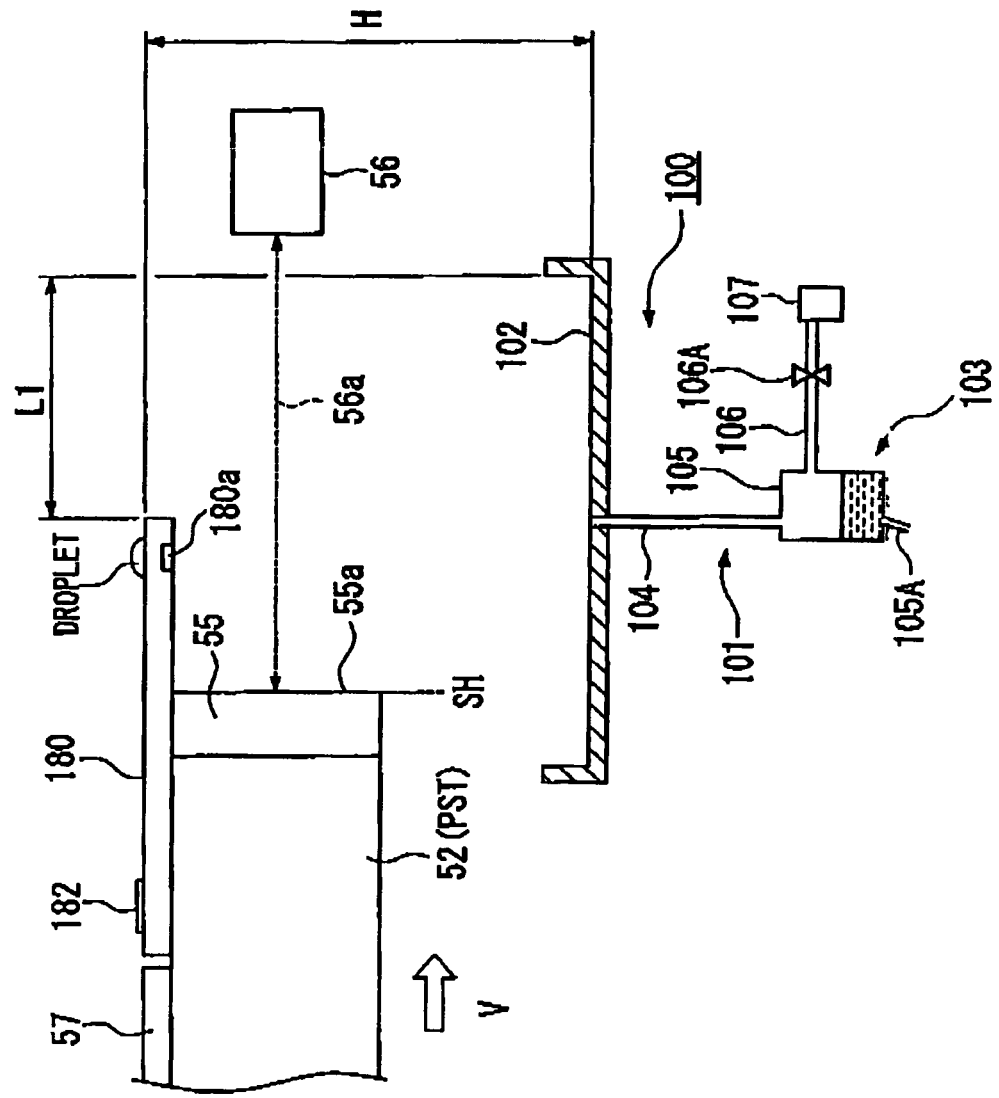
FIG. 21 is a schematic view showing an aspect wherein a shield member is provided on the upper side of a movable mirror.

FIG. 21 is a side view that depicts an embodiment wherein a shield member (or eaves member) 180 is provided to the upper side of the movable mirror 55 in order to prevent the adherence of the liquid 1 thereto. In FIG. 21, the movable mirror 55 is attached to the side part of the Z stage 52 (substrate stage PST). Furthermore, the shield member 180 is attached to the upper surface of the Z stage 52 so that it partially protrudes to the outer side thereof. The movable mirror 55 is shielded by providing the shield member 180, and the liquid 1 consequently does not adhere to the moveable mirror 55 even if, for example, the liquid 1 scatters from the substrate P to the outer side thereof.

The upper surface of the shield member 180 and the surface of the auxiliary plate 57 are at substantially the same height. There is a gap of approximately 0.1-1 mm between the shield member 180 and the auxiliary plate 57, and virtually none of the liquid 1 flows into the gap due to the surface tension thereof. Because the movable mirror 55 (reflecting surface 55a) is provided below the shield member 180, a measuring light 56a from the interferometer 56 passes below the shield member 180, which moves together with the substrate stage PST, and impinges the reflecting surface 55a of the movable mirror 55. The upper end of the movable mirror 55 (reflecting surface 55a) is positioned below the immersion area AR2, but the liquid 1 does not adhere to the reflecting surface 55a of the movable mirror 55, which is shielded by the protruding part of the shield member 180.

The shield member 180 is a plate shaped member and at least the upper surface thereof is liquid repellant. In the present embodiment, the shield member 180 is made of a liquid repellant material, e.g., polytetrafluoroethylene, or the like. Furthermore, the surface (upper surface) of the plate shaped member, which serves as the shield member 180, is made of, for example, a prescribed metal material or a synthetic resin material, and may be given a surface treatment, such as coating it with a liquid repellant material, e.g., a fluorine compound. By making the upper surface of the shield member 180 liquid repellant, the scattered liquid 1 is shaken off, even if it adheres to the upper surface of the shield member 180, and is easily recovered by the processing mechanism 101, which has the drain member 102 disposed below the shield member 180, without pooling on the shield member 180 (on the substrate stage PST).

The end surface and the lower surface—not just the upper surface—of the shield member 180 can also be treated in advance to make them liquid repellant. In addition, a groove 180a may be provided in the lower surface of the shield member 180, in the vicinity of the end part thereof, over all or part of the reflecting surface of the movable mirror 55 in the longitudinal direction thereof. This groove 180a can prevent the adherence of the liquid 1, which comes around from the end of the shield member 180 to the movable mirror 55.

In the present embodiment, the size of the drain member 102, which constitutes the second liquid removing mechanism 100, is set in accordance with the size of the shield member 180, a distance H between the shield member 180 and the drain member 102, and the travel speed V of the substrate stage PST that supports the shield member 180. More specifically, when, for example, the substrate stage PST moves in the +X direction at the speed V and then stops at a liquid removal process position SH, a distance L1 between the front part of the shield member 180 and the end part of the drain member 102 on the +X side is set in accordance with the travel speed V of the substrate stage PST and the distance H between the shield member 180 and the drain member 102 in the Z axial direction. Namely, if a droplet of the liquid 1 is disposed on the upper surface of the shield member 180 at the front part as depicted in FIG. 21, then the substrate stage PST moves in the +X direction at the speed V and then stops at the liquid removal process position SH. Using that stopped time as a reference, the position x of the droplet in the X axial direction after time t is defined by $x=Vt$, and the position z in the Z axial direction is defined by $z=H-(gt^2)/2$ (wherein g is the gravitational acceleration). Accordingly, it is possible to derive the minimum value of the size L1 of the drain member 102 from these two equations so that the droplet of the liquid 1, which dropped from the shield member 180, can be recovered by the drain member 102. At this time, the upper surface of the shield member 180 is liquid repellant, and therefore the liquid 1 adhering to that upper surface is smoothly separated therefrom and drops to the drain member 102.

In addition, as depicted in FIG. 21, a vibrating apparatus 182, which includes a piezoelectric device and the like, can be attached to the shield member 180. Vibrating the shield member 180 with the piezoelectric device (vibrating apparatus) 182 promotes the removal of the liquid 1 from the shield member 180. In addition, piezoelectric devices 182 may be provided at a plurality of prescribed positions so that they generate a traveling wave in the shield member 180.

Furthermore, the drain member 102 used in the present embodiment may be disposed not only at the lower part of the movable mirror 55, but also at the bottom part of the Z stage 52 around the entire circumference thereof. For example, the second liquid removing mechanism 100 explained in FIG. 6 may be provided on the XY stage 53 that supports the Z stage 52, and the drain member 102 of this second liquid removing mechanism 100 may be disposed so that it surrounds the Z stage 52. In this case, as depicted in the figure, the surface at which the drain member 102 receives the liquid is set so that it is positioned below (in the −Z direction) the holding surface at which the Z stage 52 holds the substrate P (e.g., the support surface of the substrate holder), the aperture surface of the groove part (recovery port) 33 that constitutes part of the liquid recovery apparatus 30 formed in the upper surface of the auxiliary plate 57 and in the Z stage 52, and the like. In addition, the end part of the holding surface of the Z stage 52 (including the end part of the movable mirror 55) is positioned in advance above the part of the drain member 102 that receives the liquid. According to such a constitution, the liquid, which was not completely recovered by the liquid recovery apparatus 30 and that dropped from the end part of the Z stage 52, is received by the drain member 102, and that liquid can be removed or recovered by the liquid removing mechanism 100. In addition, the liquid, which dropped from the optical element 2 at the front of the projection optical system PL and from the lens cell LS that holds the optical element 2, is received by this drain member 102 and can be removed or recovered.

Furthermore, the drain member 102 can also prevent the liquid from dropping on and adhering to the XY stage 53. Consequently, it is possible to prevent the scattering of the liquid to locations where it is undesirable for such to adhere, such as the drive parts of the Z stage 52 and the XY stage 53, the surface of the base 54, and the like. Accordingly, it is possible to suppress a decrease in the positioning accuracy of the substrate and to form the desired pattern thereon with good accuracy. Furthermore, the drain member 102 may also be provided on the upper surface of the XY stage 53 (on the side of the XY stage 53 with the surface opposing the Z stage 52), so that it acts like a shield for the lower surface, and the side part of the end surface, of the Z stage 52 (on the side of the Z stage 52 with the surface opposing the XY stage).

As discussed above, the liquid 1 in the present embodiment includes pure water. Pure water is advantageous because it can be easily obtained in large quantities ar a semiconductor fabrication plant and the like, and because pure water has no adverse impact on the optical elements (lenses), the photoresist on the substrate P, and the like. In addition, because pure water has no adverse impact on the environment and has an extremely low impurity context, it can also be expected to have the effect of cleaning the surface of the substrate P and the surface of the optical element provided on the front surface of the projection optical system PL.

Further, because the refractive index n of pure water (water) for the exposure light EL that has a wavelength of approximately 193 nm is said to be substantially 1.44, the use of ArF excimer laser light (193 nm wavelength) as the light source of the exposure light EL would shorten the wavelength on the substrate P to 1/n, i.e., approximately 134 nm, thereby obtaining a high resolution. Furthermore, because the depth of focus will increase approximately n times, i.e., approximately 1.44 times, that of in air, the numerical aperture of the projection optical system PL can be further increased if it is preferable to ensure a depth of focus approximately the same as that when used in air, and the resolution is also improved from this standpoint.

In the present embodiment, the optical element 2 is attached to the front of the projection optical system PL, and this lens can adjust the optical characteristics, e.g., aberrations (spherical aberration, coma aberration, and the like), of the projection optical system PL. Furthermore, the optical element attached to the front of the projection optical system PL may be the optical plate used to adjust the optical characteristic of the projection optical system PL. Alternatively, it may be a parallel plane plate capable of transmitting the exposure light EL.

Furthermore, if the pressure generated by the flow of the liquid 1 between the optical element at the front of the projection optical system PL and the substrate P is large, then the optical element may be rigidly fixed by that pressure so that it does not move, instead of making that optical element exchangeable.

Furthermore, the present embodiment is constituted so that the liquid 1 is filled between the projection optical system PL and the surface of the substrate P, but it may be constituted so that, for example, the liquid 1 is filled in a state wherein a cover glass, including a parallel plane plate, is attached to the surface of the substrate P.

Furthermore, although the liquid 1 in the present embodiment is water, it may be a liquid other than water; for example, if the light source of the exposure light EL is an $F_2$ laser, then the $F_2$ laser light will not transmit through water, so it would be acceptable to use as the liquid 1 a fluorine based fluid, such as perfluorinated polyether (PFPE) or fluorine based oil, that is capable of transmitting $F_2$ laser light. In this case, the portion that contacts the liquid 1 is given lyophilic treatment by, for example, forming a thin film with a substance that has a low polarity molecular structure that contains fluorine. In addition, it is also possible to use as the liquid 1 one (e.g., cedar oil) that is transparent to the exposure light EL, has the highest possible refractive index, and is stable with respect to the projection optical system PL and the photoresist coated on the surface of the substrate P. In this case as well, the surface treatment is performed in accordance with the polarity of the liquid 1 used.

Furthermore, the substrate P in each of the abovementioned embodiments is not limited to a semiconductor wafer for fabricating semiconductor devices, and is also applicable to a glass substrate for a display device, a ceramic wafer for a thin film magnetic head, or a mask or original plate of a reticle (synthetic quartz, silicon wafer) used by an exposure apparatus, and the like.

In addition to a step-and-scan system scanning type exposure apparatus (scanning stepper) that scans and exposes the pattern of the mask M by synchronously moving the mask M and the substrate P, a step-and-repeat system projection exposure apparatus (stepper) that exposes the full pattern of the mask M with the mask M and the substrate P in a stationary state and sequentially steps the substrate P is also applicable as the exposure apparatus EX. In addition, the present invention is also applicable to a step-and-stitch system exposure apparatus that partially and superimposingly transfers at least two patterns onto the substrate P.

In addition, the present invention is also applicable to the twin stage type scanning steppers disclosed in Japanese Unexamined Patent Application, First Publication No. H10-163099 and the corresponding U.S. Pat. No. 6,341,007, Japanese Unexamined Patent Application, First Publication No. H10-214783 and the corresponding U.S. Pat. No. 6,341,007, Published Japanese Translation No. 2000-505958 of the PCT International Publication and the corresponding U.S. Pat. No. 5,969,441, and the like.

Furthermore, the disclosures of the abovementioned Japanese publications and the corresponding U.S. patents are each hereby incorporated by reference in its entirety to the extent permitted by the national laws and regulations of the designated states (or elected states) designated by the present international patent application.

In addition, in the embodiments discussed above, an exposure apparatus is used that locally fills liquid between the projection optical system PL and the substrate P, but the present invention is also applicable to a liquid immersion exposure apparatus that moves a stage, which holds the substrate to be exposed, in a liquid bath, as disclosed in Japanese Unexamined Patent Application, First Publication No. H06-124873.

In addition, the disclosure of the abovementioned Japanese publication is hereby incorporated by reference in its entirety to the extent permitted by the national laws and regulations of the designated states (or elected states) designated by the present international patent application.

The type of exposure apparatus EX is not limited to semiconductor device fabrication exposure apparatuses that expose the pattern of a semiconductor device on the substrate P, but is also widely applicable to exposure apparatuses for fabricating liquid crystal devices or displays, exposure apparatuses for fabricating thin film magnetic heads, imaging devices (CCD), or reticles and masks, and the like.

If a linear motor is used in the substrate stage PST or the mask stage MST, as disclosed in U.S. Pat. No. 5,623,853 and U.S. Pat. No. 5,528,118, then either an air levitation type that uses an air bearing or a magnetic levitation type that uses Lorentz's force or reactance force may be used. In addition, each of the stage PST, MST may be a type that moves along a guide or may be a guideless type not provided with a guide.

The disclosure of the abovementioned U.S. patents are each hereby incorporated by reference in its entirety to the extent permitted by the national laws and regulations of the designated states (or elected states) designated by the present international patent application.

For the drive mechanism of each of the stages PST, MST, a planar motor may be used that opposes a magnet unit, wherein magnets are disposed two dimensionally to an armature unit, wherein coils are disposed two dimensionally, and drives each of the stages PST, MST by electromagnetic force. In this case, any one among the magnet unit and the armature unit is connected to the stages PST, MST and the other one of the magnet unit and the armature unit should be provided on the moving surface side of the stages PST, MST.

The reaction force generated by the movement of the substrate stage PST may be mechanically discharged to the floor (ground) using a frame member so that it is not transmitted to the projection optical system PL, as recited in Japanese Unexamined Patent Application, First Publication No. H08-166475 and the corresponding U.S. Pat. No. 5,528,118.

The disclosures of the abovementioned Japanese publication and the corresponding U.S. patent are each hereby incorporated by reference in its entirety to the extent permitted by the national laws and regulations of the designated states (or elected states) designated by the present international patent application.

The reaction force generated by the movement of the mask stage MST may be mechanically discharged to the floor (ground) using a frame member so that it is not transmitted to the projection optical system PL, as recited in Japanese Unexamined Patent Application, First Publication No. H08-330224 and the corresponding U.S. Pat. No. 5,874,820.

The disclosures of the abovementioned Japanese publication and the corresponding U.S. Patent are each hereby incorporated by reference in its entirety to the extend permitted by the national laws and regulations of the designated states (or elected states) designated by the present international patent application.

The exposure apparatus EX of the embodiments in the present application as described above is manufactured by assembling various subsystems, including each constituent element recited in the claims of the present application, so that a prescribed mechanical accuracy, electrical accuracy, and optical accuracy are maintained. To ensure these various accuracies, adjustments are performed before and after this assembly, including an adjustment to achieve optical accuracy for the various optical systems, an adjustment to achieve mechanical accuracy for the various mechanical systems, and an adjustment to achieve electrical accuracy for the various electrical systems. The assembly process from the various subsystems to the exposure apparatus includes the mutual mechanical connection of the various subsystems, the wiring and connection of electrical circuits, the piping and connection of the atmospheric pressure circuit, and the like. Naturally, before the assembly process, ranging from these various subsystems to the exposure apparatus, there are processes for assembling each of the individual subsystems. When the assembly process from various subsystems to the exposure apparatus has completed, a comprehensive adjustment is performed to ensure the various accuracies of the exposure apparatus as a whole. Furthermore, it is preferable to manufacture the exposure apparatus in a clean room wherein the temperature, the cleanliness level, and the like, are controlled.

Figure 22:
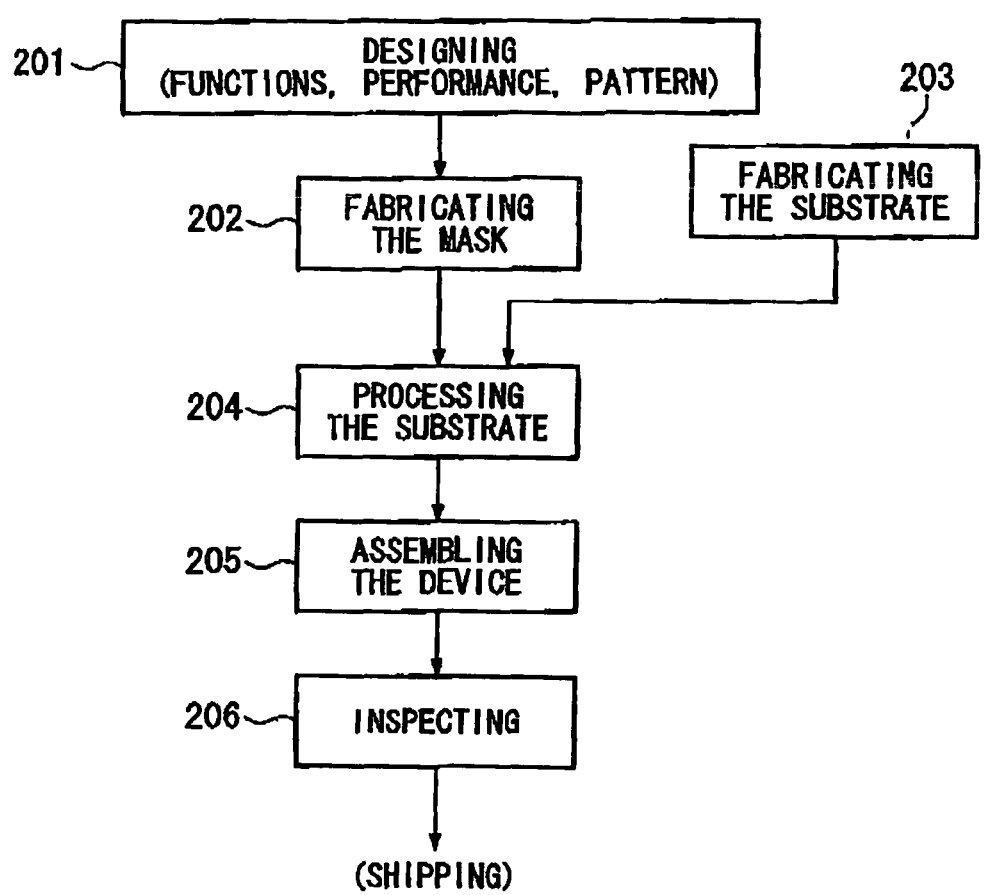
FIG. 22 is a flowchart showing one example of the process for manufacturing a semiconductor device.

As shown in FIG. 22, a micro-device, such as a semiconductor device is manufactured by: a step 201 that designs the functions and performance of the micro-device; a step 202 that fabricates a mask (reticle) based on this design step, a step 203 that fabricates a substrate, which is the base material of the device; a substrate processing step 204 wherein the exposure apparatus EX of the embodiments discussed above exposes a pattern of the mask onto the substrate; a device assembling step 205 (including a dicing process, a bonding process, and a packaging process); an inspecting step 206; and the like.

According to the present invention, by removing unnecessary liquid, which remained after the exposure and adhered, and unnecessary liquid, which scattered during exposure and adhered, it is possible to prevent the deterioration of the exposure accuracy due to this unnecessary liquid, and to form a desired pattern on a substrate with good accuracy.

What is claimed is:

1. An exposure apparatus that exposes a substrate by filling a liquid between a projection optical system and the substrate, and projecting an image of a pattern onto the substrate through the projection optical system and the liquid, the apparatus comprising:

a liquid supply system having a supply port from which the liquid is supplied, an optical path between a lower end surface of the projection optical system and an upper surface of the substrate being filled with the liquid of a liquid immersion area, and less than an entirety of the upper surface of the substrate being covered by the liquid supplied from the supply port during exposure of the substrate, the liquid immersion area being moved relative to the substrate during the exposure;

a component which is moved to a position in a vicinity of an image plane of the projection optical system;

a shield member that prevents an adherence of the liquid to the component, the shield member being provided directly over the component and protruding laterally beyond an upper surface of the component in a direction radially outward of the component with respect to a holder portion that holds the substrate, the shield member being provided below the lower end surface of the projection optical system, and the shield member having an upper surface, the upper surface of the shield member being liquid repellent with respect to the liquid; and an auxiliary plate provided on a substrate holding member, which includes the holder portion, the auxiliary plate having an upper surface, the upper surface of the auxiliary plate being coplanar with the upper surface of the shield member, wherein the liquid of the liquid immersion area is capable of being located on the shield member, and the auxiliary plate surrounds the substrate and is located between the substrate and the shield member when the substrate is held on the substrate holding member by the holder portion.

2. An exposure apparatus according to claim 1, wherein the component is attached to a side part of the substrate holding member, that holds and moves the substrate.

3. An exposure apparatus according to claim 2, wherein the component includes a reflecting mirror, upon which a light is irradiated from an interferometer that measures position information of the substrate holding member.

4. The exposure apparatus according to claim 2, wherein the substrate holding member is configured to direct the liquid of the liquid immersion area that is relatively moved on the substrate held by the substrate holding member during the exposure from a first region of the substrate to a second region of the substrate, such that the first region of the substrate does not contact the liquid after the liquid of the liquid immersion area has moved to the second region.

5. An exposure apparatus according to claim 1, further comprising:
a drain member that is disposed below the shield member.

6. An exposure apparatus according to claim 5, wherein
a size of the drain member is set in accordance with a size of the shield member, a distance between the shield member and the drain member, and a movement velocity of the substrate holding member, which supports the shield member and which holds and moves the substrate.

7. An exposure apparatus according to claim 1, further comprising:
a vibrating apparatus that vibrates the shield member.

8. A device manufacturing method comprising:
exposing a substrate by using the exposure apparatus of claim 1; and
processing the exposed substrate.

9. The exposure apparatus according to claim 1, wherein the upper surface of the shield member directly over a top surface of the component is disposed in substantially a same plane as the upper surface of the substrate.

10. The exposure apparatus according to claim 1, wherein the auxiliary plate and the shield member are disposed side by side.

11. The exposure apparatus according to claim 1, wherein a part of the shield member projects outside the substrate holding member.

12. An exposure apparatus according to claim 1, wherein the shield member has a groove on a lower surface of the shield member.

13. An exposure apparatus according to claim 1, wherein each of the upper surface, an end surface and a lower surface of the shield member are treated in advance with a liquid repellent.

14. A stage system used in an exposure apparatus, the stage system comprising:
a substrate holding member that is movable in the exposure apparatus and that has a holder portion to hold a substrate to be exposed through a projection optical system and a liquid in the exposure apparatus, an optical path between a lower end surface of the projection optical system and an upper surface of the substrate being filled with the liquid of a liquid immersion area and less than an entirety of the upper surface of the substrate being covered by the liquid immersion area during exposure of the substrate in the exposure apparatus, the liquid immersion area being moved relative to the substrate during the exposure;

a component that is movable along with the substrate holding member in the exposure apparatus;

an edge member provided at an end part of the substrate holding member, the edge member being provided below the end surface of the projection optical system, the edge member overhanging the component and protruding laterally beyond an upper surface of the component in a direction radially outward of the component with respect to the holder portion, and an upper surface of the edge member being substantially in a same plane as the upper surface of the substrate when the substrate is held on the substrate holding member, the liquid of the liquid immersion area being capable of being located on the edge member; and a surrounding portion provided on the substrate holding member, wherein the surrounding portion surrounds the substrate and is located between the substrate and the edge member when the substrate is held on the substrate holding member, wherein the upper surface of the edge member is liquid repellent with respect to the liquid.

15. The system according to claim 14, wherein the component is provided at the substrate holding member.

16. The system according to claim 15, wherein the component includes a measurement member which is used to obtain positional information of the substrate holding member in the exposure apparatus.

17. The system according to claim 16, wherein the measurement member includes a reflecting surface on which a measuring beam is to be incident.

18. The system according to claim 14, wherein the upper surface of the surrounding portion is substantially in a same plane as the surface of the substrate when the substrate is held on the substrate holding member.

19. The system according to claim 14, wherein the edge member prevents the liquid from dropping on the component.

20. The system according to claim 14, wherein
the edge member is protruded in a direction such that the edge member sticks out over the component, and
a shot area of the substrate held on the substrate holding member is exposed while moving the substrate holding member in the direction in the exposure apparatus.

21. The system according to claim 14, wherein
the exposure apparatus includes a supply port to supply the liquid and a recovery port to recover the supplied liquid,
the edge member is protruded in a direction such that the edge member sticks out over the component, and
the liquid is supplied from the supply port disposed on one side of an optical path of an exposure beam with which the substrate is exposed, and is recovered by the recovery port disposed on an other side of the optical path, with respect to a scanning direction in the exposure apparatus.

22. The stage system according to claim 14, wherein the surrounding portion and the edge member are disposed side by side.

23. The stage system according to claim 14, wherein a part of the edge member projects outside the substrate holding member.

24. The stage system according to claim 14, wherein the substrate holding member is configured to direct the liquid of the liquid immersion area that is relatively moved on the substrate held by the substrate holding member during the exposure from a first region of the substrate to a second region of the substrate, such that the first region of the substrate does not contact the liquid after the liquid of the liquid immersion area has moved to the second region.

25. The system according to claim 14, wherein the edge member has a groove on a lower surface of the edge member.

26. The system according to claim 14, wherein each of the upper surface, an end surface and a lower surface of the edge member are treated in advance with a liquid repellent.

27. An exposure apparatus comprising:
a projection optical system;
a substrate holding member that is movable and that has a holder portion to hold a substrate to be exposed through the projection optical system and a liquid, an optical path between a lower end surface of the projection optical system and an upper surface of the substrate being filled with the liquid of a liquid immersion area and less than an entirety of the upper surface of the substrate being covered by the liquid immersion area during exposure of the substrate, the liquid immersion area being moved relative to the substrate during the exposure;
a component that is movable along with the substrate holding member;
an edge member provided at an end part of the substrate holding member, the edge member being provided below the lower end surface of the projection optical system, the edge member protruding laterally beyond an upper surface of the component in a direction radially outward of the component with respect to the holder portion, the edge member overhanging the component, and an upper surface of the edge member being substantially in a same plane as the upper surface of the substrate when the substrate is held on the substrate holding member, the liquid of the liquid immersion area being capable of being located on the edge member; and
a surrounding portion provided on the substrate holding member, wherein the surrounding portion surrounds the substrate and is located between the substrate and the edge member when the substrate is held on the substrate holding member, wherein the upper surface of the edge member is liquid repellent with respect to the liquid.

28. The apparatus according to claim 27, further comprising a liquid removing system by which residual liquid is removed from the edge member.

29. The apparatus according to claim 28, wherein the liquid removing system includes a vibrating apparatus which vibrates the edge member.

30. A device manufacturing method comprising:
exposing a substrate by using the exposure apparatus of claim 27; and
processing the exposed substrate.

31. The exposure apparatus according to claim 27, wherein the surrounding portion and the edge member are disposed side by side.

32. The exposure apparatus according to claim 27, wherein a part of the edge member projects outside the substrate holding member.

33. The exposure apparatus according to claim 27, wherein the substrate holding member is configured to direct the liquid of the liquid immersion area that is relatively moved on the substrate held by the substrate holding member during the exposure from a first region of the substrate to a second region of the substrate, such that the first region of the substrate does not contact the liquid after the liquid of the liquid immersion area has moved to the second region.

34. The apparatus according to claim 27, wherein the edge member has a groove on a lower surface of the edge member.

35. The apparatus according to claim 27, wherein each of the upper surface, an end surface and a lower surface of the edge member are treated in advance with a liquid repellent.

36. An exposure method comprising:
holding a substrate on a substrate holding member which has a holder portion to hold the substrate and a surrounding portion surrounding the substrate held by the holder portion;
supplying a liquid on the substrate such that an optical path between a lower end surface of a projection optical system and an upper surface of the substrate is filled with the supplied liquid of a liquid immersion area and less than an entirety of the upper surface of the substrate is covered by the liquid immersion area; and
exposing the substrate held on the substrate holding member with an exposure beam through the liquid immersion area, while moving the substrate holding member, the liquid immersion area being moved relative to the substrate during the exposure, wherein
an edge member is provided at an end of the substrate holding member such that the edge member overhangs and protrudes laterally beyond an upper surface of a component that is moved along with the substrate holding member in a direction radially outward of the component with respect to the holder portion, the surrounding portion being located between the substrate and the edge member when the substrate is held on the substrate holding member,
the liquid of the liquid immersion area being capable of being located on the edge member, and the edge member is provided below the lower surface of the projection optical system, and an upper surface of the edge member is substantially in a same plane as the upper surface of the substrate held on the substrate holding member, and
the upper surface of the edge member is liquid repellent with respect to the liquid.

37. The method according to claim 36, further comprising obtaining position information of the substrate holding member by using the component.

38. The method according to claim 36, wherein the edge member prevents the liquid from dropping on the component.

39. The method according to claim 36, wherein the surrounding portion and the edge member are disposed side by side.

40. The method according to claim 36, wherein a part of the edge member projects outside the substrate holding member.

41. The method according to claim 36, wherein the substrate holding member is configured to direct the liquid of the liquid immersion area that is relatively moved on the substrate held by the substrate holding member during the exposure from a first region of the substrate to a second region of the substrate, such that the first region of the substrate does not contact the liquid after the liquid of the liquid immersion area has moved to the second region.

42. The method according to claim 36, wherein the edge member has a groove on a lower surface of the edge member.

43. The method according to claim 36, wherein each of the upper surface, an end surface and a lower surface of the edge member are treated in advance with a liquid repellent.

* * * * *